United States Patent
Moon et al.

(10) Patent No.: US 9,183,902 B2
(45) Date of Patent: Nov. 10, 2015

(54) INPUT DATA ALIGNMENT CIRCUIT AND SEMICONDUCTOR DEVICE INCLUDING THE SAME

(71) Applicant: SAMSUNG ELECTRONICS CO., LTD., Suwon-si, Gyeonggi-do (KR)

(72) Inventors: Dae-sik Moon, Suwon-si (KR); Seung-jun Bae, Hwaseong-si (KR); Joon-young Park, Seoul (KR); Yoon-joo Eom, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/460,561

(22) Filed: Aug. 15, 2014

(65) Prior Publication Data

US 2015/0063008 A1    Mar. 5, 2015

Related U.S. Application Data

(60) Provisional application No. 61/870,958, filed on Aug. 28, 2013.

(30) Foreign Application Priority Data

Nov. 29, 2013 (KR) ......... 10-2013-0147814

(51) Int. Cl.
*G11C 7/00* (2006.01)
*G11C 7/10* (2006.01)
*G11C 7/22* (2006.01)
*G11C 11/4076* (2006.01)
*G11C 11/4093* (2006.01)

(52) U.S. Cl.
CPC ............ *G11C 7/1087* (2013.01); *G11C 7/1012* (2013.01); *G11C 7/1093* (2013.01); *G11C 7/222* (2013.01); *G11C 11/4076* (2013.01); *G11C 11/4093* (2013.01)

(58) Field of Classification Search
CPC ......... G11C 7/22; G11C 7/051; G11C 7/1066
USPC ............... 365/154, 193, 194, 189.02, 189.05; 713/500

See application file for complete search history.

(56) References Cited

U.S. PATENT DOCUMENTS

| | | | |
|---|---|---|---|
| 6,373,414 B2 * | 4/2002 | Koga et al. | ..................... 341/100 |
| 6,909,643 B2 | 6/2005 | Kwean | |
| 6,987,704 B2 | 1/2006 | Park | |
| 7,304,898 B2 | 12/2007 | Lee et al. | |
| 7,679,986 B2 | 3/2010 | Lee | |
| 7,869,286 B2 | 1/2011 | Park et al. | |
| 7,975,162 B2 * | 7/2011 | Kim et al. | ..................... 713/500 |
| 2005/0138277 A1 | 6/2005 | Koo | |
| 2007/0002644 A1 | 1/2007 | Kang | |

FOREIGN PATENT DOCUMENTS

KR     10-2003-0003426 A     1/2003

* cited by examiner

*Primary Examiner* — Son Dinh
(74) *Attorney, Agent, or Firm* — Lee & Morse, P.C.

(57) ABSTRACT

An input data alignment circuit includes a data sampler, a frequency divider, a polarity determination block, and a data alignment block. The data sampler provides a data sequence based on data serially input according to a data strobe signal. The frequency divider generates a data alignment signal based on a divided frequency of the data strobe signal. The polarity determination block determines a polarity of the data alignment signal and provides a control signal based on the determined polarity. The data alignment block aligns the data sequence in parallel according to data alignment signal and control signal and generates output data.

20 Claims, 20 Drawing Sheets

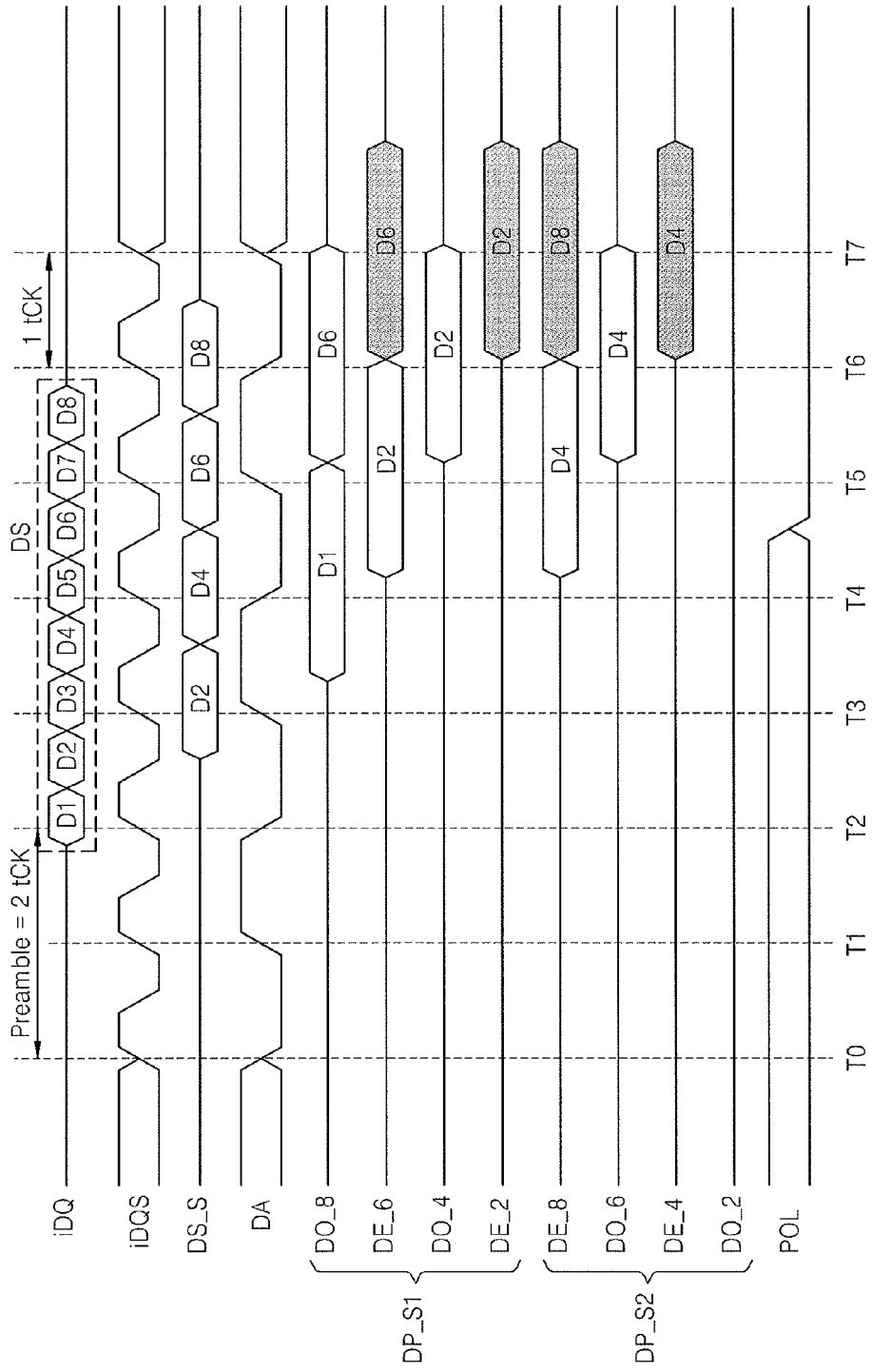

INPUT DATA ALIGNMENT CIRCUIT AND SEMICONDUCTOR DEVICE INCLUDING THE SAME

CROSS-REFERENCE TO RELATED APPLICATION

The present application claims benefit under 35 U.S.C. §119(e) to U.S. Provisional Application No. 61/870,958, filed on Aug. 28, 2013, and claims priority to Korean Patent Application No. 10-2013-0147814, filed on Nov. 29, 2013, and entitled, "Input Data Alignment Circuit And Semiconductor Device Including The Same," both of which are incorporated herein by reference in their entirety.

BACKGROUND

1. Field

One or more embodiments described herein relate to storing data.

2. Description of the Related Art

A variety of semiconductor memory devices have been developed. Over the years, these devices have increased in terms of their integration and operating speed. For example, a dynamic random access memory (DRAM) has been used as a cache memory of a central processing unit (CPU) because of its integration scale and fast data writing or reading speeds. DRAMs have been used for this purpose even though they are volatile memories, e.g., ones in which stored data is lost when powered off.

A synchronous semiconductor memory device processes data using a clock signal. In order to increase bandwidth, a synchronous semiconductor memory device may operate in a double data rate (DDR) mode. In this mode, data is processed at rising and falling edges of the clock signal. A DDR memory device may therefore double bandwidth without increasing clock signal frequency. A DDR memory device may be controlled by a memory controller, which communicates with the DDR memory device and which may control transmission or reception of data in DDR mode.

SUMMARY

In accordance with one embodiment, an input data alignment circuit which includes an input data sampler to provide a data sequence based on data serially input according to a data strobe signal; a frequency divider to generate a data alignment signal based on a divided frequency of the data strobe signal; a polarity determination block to determine a polarity of the data alignment signal and to provide a control signal based on the determined polarity; and a data alignment block to align the data sequence in parallel according to data alignment signal and control signal and generate output data.

The data alignment block may include first and second alignment blocks to respectively output first and second data by aligning one of sequences that are synchronized with the data alignment signal or include odd data and even data of the data sequence in parallel; and a selection block to select and output a portion of the first and second data based on the control signal. Each of the first and second alignment blocks may align the odd data or the even data of the data sequence in parallel based on the polarity of the data alignment signal.

The first alignment block may include a rising edge trigger flip-flop and at least one first latch which are controlled by the data alignment signal and are serially connected, wherein first data is output from the rising edge trigger flip-flop and the at least one first latch. The second alignment block may include a falling edge trigger flip-flop and at least one second latch which are controlled by the data alignment signal and serially connected, wherein second data is output from the falling edge trigger flip-flop and the at least one second latch.

The polarity determination block may include a first sampler to sample a trigger signal that prearranges serial input of the data by the input data strobe signal; a delay unit to delay a signal output from the first sampler; and a second sampler to sample the data alignment signal based on a signal output from the delay unit, the second sampler to output the control signal.

The delay unit may delay the signal output from the first sampler by less than a cycle of the input data strobe signal. The polarity determination block may output a sample signal based on delaying the trigger signal, and the input data alignment circuit may include an output data sampler to sample the output data as the sample signal.

In accordance with another embodiment, a semiconductor device includes an input data alignment circuit to generate output data by aligning data in parallel and to output the output data via N number of paths, the output data based on data serially input according to a data strobe signal; and a data storage block including N number of memory blocks in which the output data is to be simultaneously written, wherein the input data alignment circuit is to generate a data alignment signal by dividing a frequency of the data strobe signal, align the data that is serially input in parallel according to a polarity of the data alignment signal, and to generate the output data.

The input data alignment circuit may include an input data sampler to provide the serially input data according to the data strobe signal as a data sequence; a frequency divider to divide a frequency of the data strobe signal and to thereby generate the data alignment signal; a polarity determination block to determine the polarity of the data alignment signal and to thereby provide a control signal; and a data alignment block to align the data sequence in parallel according to the data alignment signal and the control signal, and to thereby generate output data.

The data alignment block may include first and second alignment blocks to respectively output first and second data by aligning one of sequences that are synchronized with the data alignment signal or that include odd data and even data of the data sequence in parallel; and a selection block to select and output a portion of the first and second data based on the control signal. Each of the first and second alignment blocks may align the odd data or the even data of the data sequence in parallel based on the polarity of the data alignment signal.

The polarity determination block may include a first sampler to sample a trigger signal that prearranges serial input of the data based on the input data strobe signal; a delay unit to delay a signal output from the first sampler; and a second sampler to sample the data alignment signal based on a signal output from the delay unit, and to thereby output the control signal. The delay unit may delay the signal output from the first sampler by less than a cycle of the input data strobe signal.

The semiconductor device may be a memory controller to control a semiconductor memory device, and the input data alignment circuit may operate in a burst read mode of the semiconductor memory device. The semiconductor device may be a semiconductor memory device, the memory block may include a plurality of dynamic random access memory (DRAM) cells, and the input data alignment circuit may operate in a burst read mode of the semiconductor memory device.

In accordance with another embodiment, an apparatus includes a first block to generate a control signal based on a polarity of a data alignment signal; and a second block to align a data sequence based on control signal, wherein the data alignment signal is based on a divided frequency of a data strobe signal and wherein the second block is to align at least one of a forward edge or a trailing edge of data blocks in the data sequence based on the data alignment signal. The apparatus may include a sampler to sample serial data based on the data strobe signal, wherein the data sequence is based on the sampled serial data.

The second block may include first and second alignment blocks to respectively output first and second data by aligning one of sequences that are synchronized with the data alignment signal or include odd data and even data of the data sequence in parallel; and a selection block to select and output a portion of the first and second data based on the control signal. Each of the first and second alignment blocks may align the odd data or even data of the data sequence in parallel based on polarity of the data alignment signal.

The first alignment block may include a rising edge trigger flip-flop and at least one first latch which are controlled by the data alignment signal, wherein first data is output from the rising edge trigger flip-flop and the at least one first latch, and the second alignment block may include a falling edge trigger flip-flop and at least one second latch which are controlled by the data alignment signal, wherein second data is output from the falling edge trigger flip-flop and the at least one second latch.

BRIEF DESCRIPTION OF THE DRAWINGS

Features will become apparent to those of skill in the art by describing in detail exemplary embodiments with reference to the attached drawings in which:

FIGS. 7A and 7B respectively illustrate operations of the first and second alignment blocks in the odd alignment block and in the even alignment lock for a data alignment signal of the first polarity;

DETAILED DESCRIPTION

Figure 1:
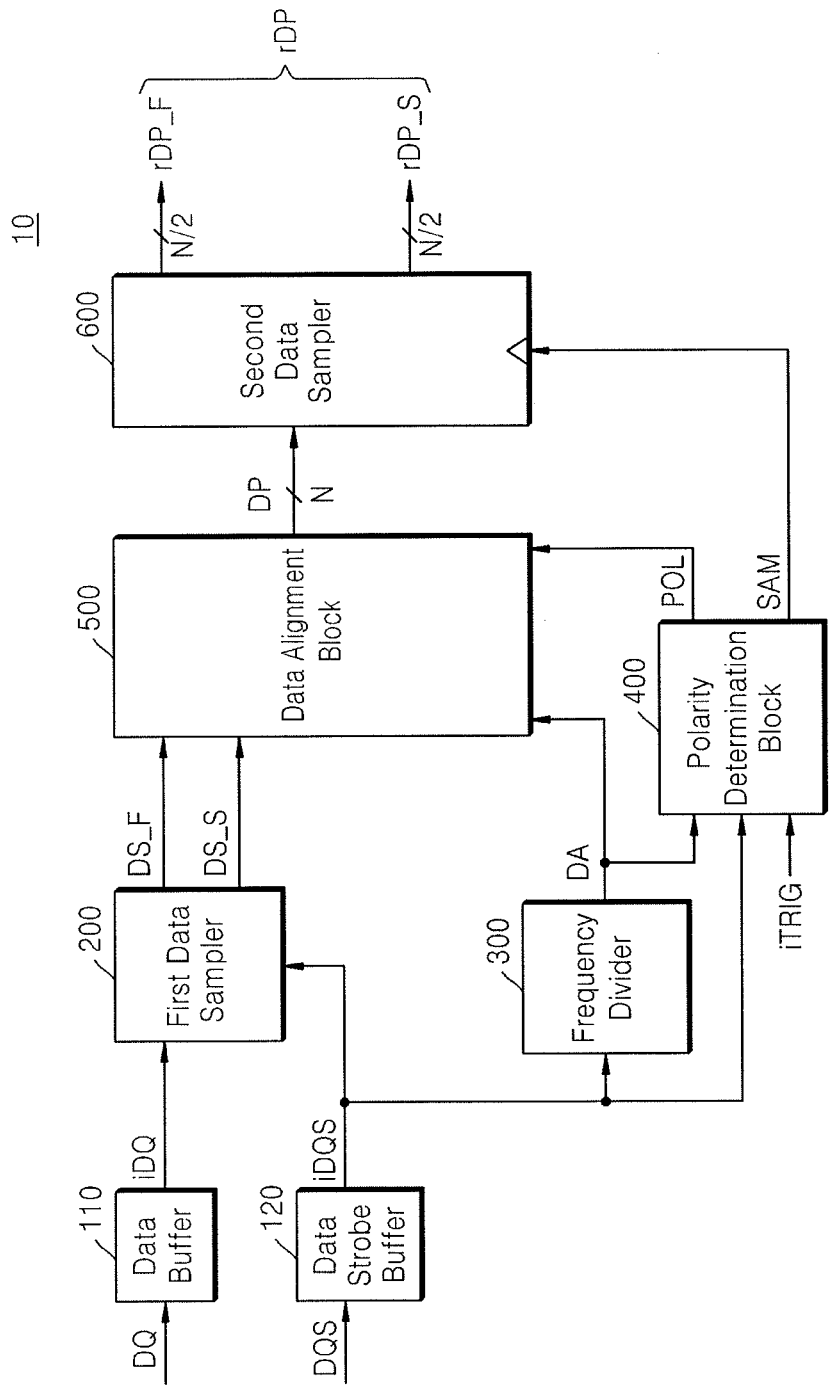
FIG. 1 illustrates an embodiment of an input data alignment circuit.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 3:
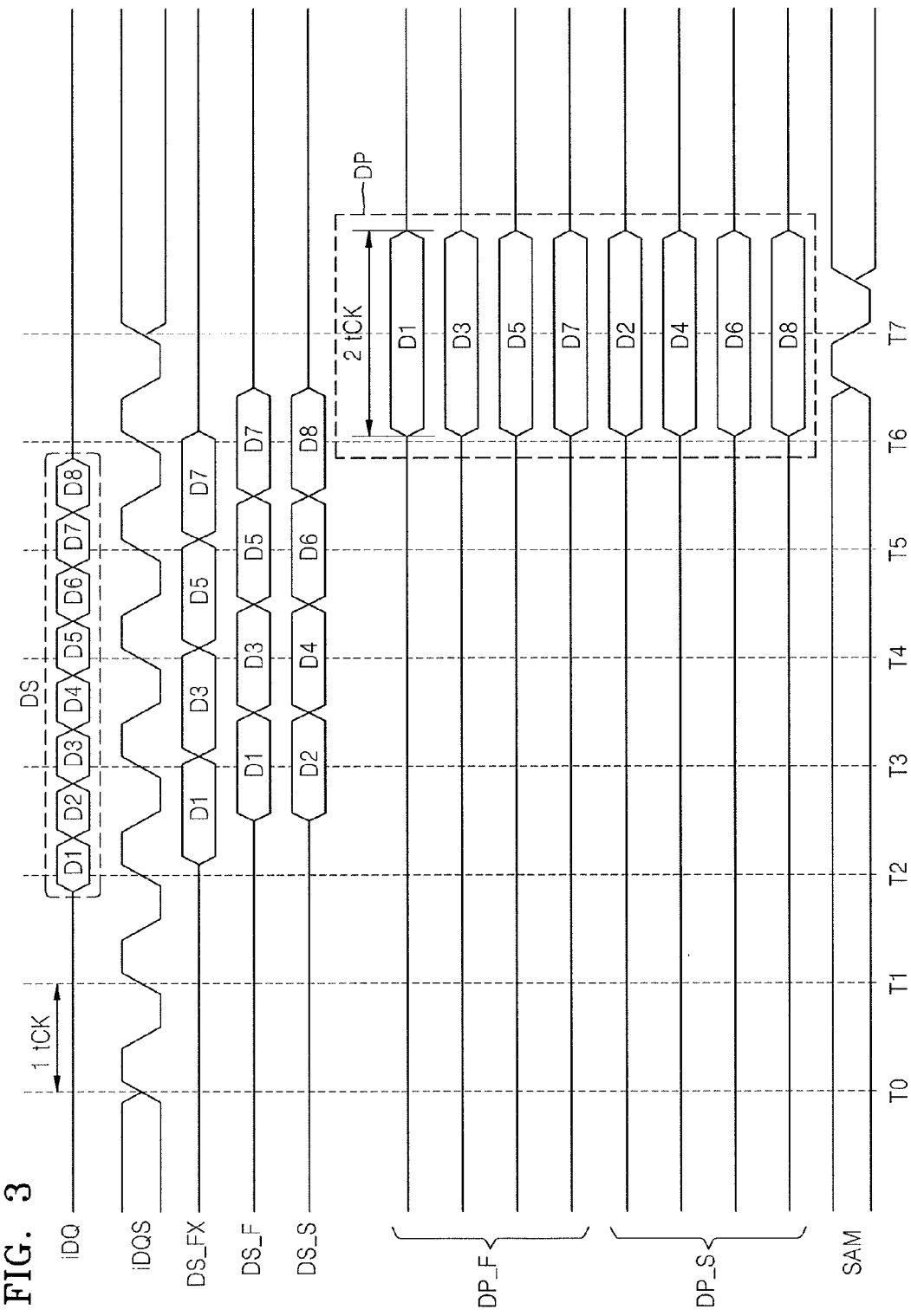
FIG. 3 illustrates an example of internal signals of the input data alignment circuit.

FIG. 1 illustrates an embodiment of an input data alignment circuit 10, and FIG. 3 is an example of a timing diagram of internal signals for controlling the input data alignment circuit 10.

Referring to FIGS. 1 and 3, input data alignment circuit 10 receive a data strobe signal DQS and a data signal DQ. The data signal DQ may include a data sequence DS that includes a series of N blocks of data synchronized with data strobe signal DQS. Also, N blocks of data rDP may be output. The output blocks may be included in and aligned in parallel with data sequence DS.

The input data alignment circuit 10 may support a double data rate (DDR) mode. Thus, data sequence DS received by input data alignment circuit 10 may include data synchronized with rising and falling edges of data strobe signal DQS. In operation, input data alignment circuit 10 may respond to each of the rising and falling edges of the data strobe signal DQS, sample the data signal DQ, and thus receive the data sequence DS.

In one embodiment, the input data alignment circuit 10 may operate in burst mode. Burst mode is an operation mode that includes, first, transmitting a signal that notifies start of the burst mode and, then, serially transmitting or receiving a predetermined number (referred to as "burst length") of data blocks. Input data alignment circuit 10 may be included in a semiconductor memory device and may operate in a burst write mode of the semiconductor memory device. The semiconductor memory device may receive write commands that correspond to the burst write mode from an external source (e.g., a memory controller) and then, serially receive data that corresponds to the burst length. A series of data that is serially received may be referred to as data sequence.

FIG. 3 illustrates a case of the input data alignment circuit 10 that outputs 8 blocks of data rDP that are aligned in parallel when the burst length is 8, e.g., when N in FIG. 1 equals 8.

In one embodiment, input data alignment circuit 10 may be included in a memory controller that controls the semiconductor memory device. The memory controller may set the semiconductor memory device to a burst read mode. The semiconductor memory device may then transmit data sequence DS that includes the series of data blocks to the memory controller based on the data signal DQ.

The input data alignment circuit 10 in the memory controller may receive data sequence DS from the semiconductor memory device, and may align data sequence DS in parallel. In other embodiments, the input data alignment circuit 10 may not be included in a device different from a semiconductor memory device, for purposes of processing data in accordance with an intended application.

In the embodiment of FIG. 1, input data alignment circuit 10 includes a data buffer 110, a data strobe buffer 120, a first data sampler 200, a frequency divider 300, a polarity determination block 400, a data alignment block 500, and a second data sampler 600. The data buffer 110 may buffer the received data signal DQ and output an internal data signal iDQ. The data strobe buffer 120 may buffer the received data strobe signal DQS and output an internal data strobe signal iDQS. The internal data signal iDQ and internal data strobe signal iDQS are generated from the data signal DQ and data strobe signal DQS, respectively.

The data strobe signal DQS may have a predetermined cycle before data sequence DS is received based on data signal DQ. For example, as illustrated in FIG. 3, internal data strobe signal iDQS may be received for 2 cycles before data sequence DS. The number of times that data strobe signal DQS oscillates before being received with data sequence DS (e.g., the number of cycles of data strobe signal DQS) may be referred to as the preamble. The preamble may be predetermined among devices that transmit and receive data, and be changed by transmitting and receiving setting signals. In FIG. 3, the preamble is illustratively shown as 2 tCK, where 1 tCK indicates 1 clock cycle time.

In one embodiment, the first data sampler 200 may receive data sequence DS from data buffer 110, and may receive internal data strobe signal iDQS from the data strobe buffer 120. The first data sampler 200 may use the internal data strobe signal iDQS to sample the data sequence DS based on the internal data signal iDQ. For example, first data sampler 200 may sample data sequence DS at each of the rising and falling edges of internal data strobe signal iDQS, and thereby generate two data sequences DS_F and DS_S.

Referring to FIGS. 1 and 3, first data sampler 200 may output data sequence DS_F that includes odd data of the data sequence DS, and data sequence DS_S that includes even data of the data sequence DS. For example, the data sequence DS_F may include data sampled from data sequence DS at a rising edge of the internal data strobe signal iDQS. Data sequence DS_S may include data sampled from data sequence DS at a falling edge of the internal data strobe signal iDQS. Therefore, as illustrated in FIG. 3, because one data sequence DS is processed into two parallel data sequences DS_F and DS_S, durations of data included in data sequence DS may be ½ tCK, and durations of data included in the data sequences DS_F or DS_S may be 1 tCK.

The frequency divider 300 may receive the internal data strobe signal iDQS, and divide a frequency of the internal data strobe signal iDQS to output a data alignment signal DA. For example, data alignment signal DA may be generated by dividing the frequency of the internal data strobe signal iDQS by a predetermined number greater than one, e.g., 2.

The polarity determination block 400 may determine a polarity of data alignment signal DA. After data alignment signal DA, which is generated by dividing the frequency of the internal data strobe signal iDQS by 2, has passed a preamble section, the data alignment signal DA that corresponds to a first block of data of data sequence DS may have different polarities. For example, at a time point when the first block of data of data sequence DS is received, data alignment signal DA may have a rising edge or a falling edge. Data alignment signal DA has different polarities due to a length of the preamble.

As described above, the internal data strobe signal iDQS may be received earlier than data sequence DS by as much as the internal data strobe signal iDQS corresponds to the length of the preamble (any number of tCKs). Also, the length of the preamble may vary according to a predetermined value. Accordingly, the polarity of data alignment signal DA may be determined depending on whether the number of cycles of the internal data strobe signal iDQS, that corresponds to the length of the preamble, is odd or even. In one embodiment, the input data alignment circuit 10 may output the data sequence DS as 8 blocks of data rDP that are aligned in parallel, independent from the polarity of the data alignment signal DA.

The polarity determination block 400 may receive a trigger signal iTRIG that prearranges input of data sequence DS. The trigger signal iTRIG provides advance notification that data sequence DS, including the series of data, will be input. The trigger signal iTRIG may be generated, for example, from signals that are generated by decoding data write commands received from the memory controller disposed outside the semiconductor memory device. In order to write data in burst write mode, the memory controller may transmit write commands, which indicate the burst write mode, to the semiconductor memory device. A command decoder 1110 of FIG. 12 may generate the trigger signal iTRIG that indicates reception of the write commands, by decoding the write commands.

The polarity determination block 400 may generate a polarity signal POL that indicates the polarity of data alignment signal DA based on internal data strobe signal iDQS, data alignment signal DA, and trigger signal iTRIG. In addition, the polarity determination block 400 may generate a sampling signal SAM that is used by the second data sampler 600 to sample data DP_F and DP_S output from data alignment block 500 according to the internal data strobe signal iDQS, data alignment signal DA, and trigger signal iTRIG. Operations of the polarity determination block 400 will be described in detail with references to FIGS. 10 and 11.

The data alignment block 500 may receive the data sequences DS_F and DS_S from the first data sampler 200, data alignment signal DA, and polarity signal POL. As illustrated in FIG. 1, data alignment block 500 may align data sequences DS_F and DS_S in parallel, so as to output data DP aligned in N number of rows.

The second data sampler 600 may receive data DP aligned in parallel from data alignment block 500, and sampling signal SAM from polarity determination block 400.

Referring to FIG. 3, near a time point T7, the second data sampler 600 may respond to a falling edge of sampling signal SAM, sample data DP received via 8 paths, and output data rDP. The data rDP may have durations that are longer than 2 tCK, and may be simultaneously stored in 8 memory blocks.

Figure 2:
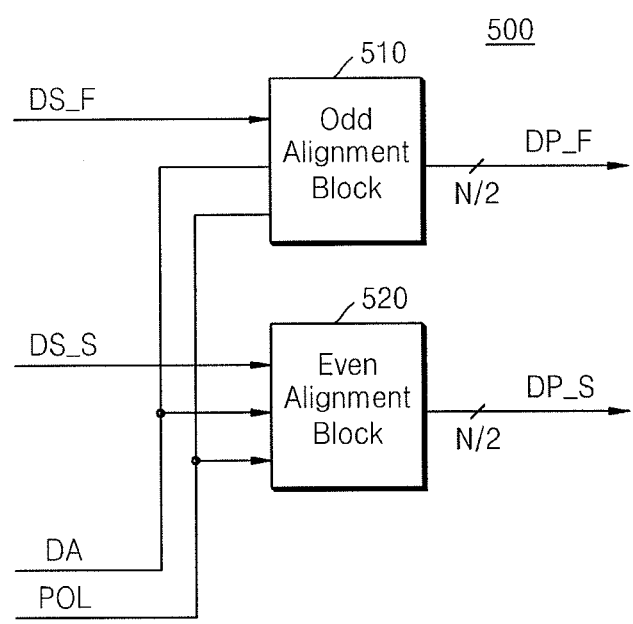
FIG. 2 illustrates an embodiment of a data alignment block.

FIG. 2 illustrates an embodiment of a data alignment block 500. As illustrated in FIG. 2, data alignment block 500 may include an odd alignment block 510 and an even alignment block 520. Referring to FIG. 1, the odd and even alignment blocks 510 and 520 may respectively receive data sequences DS_F and DS_S from first data sampler 200. Timings of data sequences DS_F and DS_S output from first data sampler 200 may be the same (e.g., may be aligned with each other). Therefore, odd and even alignment blocks 510 and 520 may respectively receive data sequences DS_F and DS_S that have the same timing. Thus, configurations of the odd and even alignment blocks 510 and 520 may be the same.

Referring to FIGS. 1 to 3, odd alignment block 510 may receive data sequence DS_F that includes the odd data of the data sequence DS, may align the data sequence DS_F in parallel using data alignment signal DA and polarity signal POL, and may output data DP_F that includes 4 blocks of data D1, D3, D5, and D7. In addition, the even alignment block 520 may receive data sequence DS_S that includes the even data of the data sequence DS, may align the data sequence DS_S in parallel using data alignment signal DA and polarity signal POL, and may output data DP_S that includes 4 blocks of data D2, D4, D6, and D8. As illustrated in FIG. 1, data DP_F and DP_S may be respectively output via 4 paths.

As illustrated in FIG. 3, durations of the data DP_F and DP_S output from the odd and even alignment blocks 510 and 520 (or, data alignment block 500 that includes odd and even alignment blocks 510 and 520) may be 2 tCK. The data sequences DS_F and DS_S that include the data having a duration of 1 tCK may pass through data alignment block 500, and thus may be aligned in parallel as data DP_F and DP_S having a duration of 2 tCK. Accordingly, an increment of the duration improves sampling margins, so that second data sampler 600 may easily sample data DP_F and the DP_S. In addition, any jitter resulting from data generated in the 8 paths may be reduced.

Figure 4:
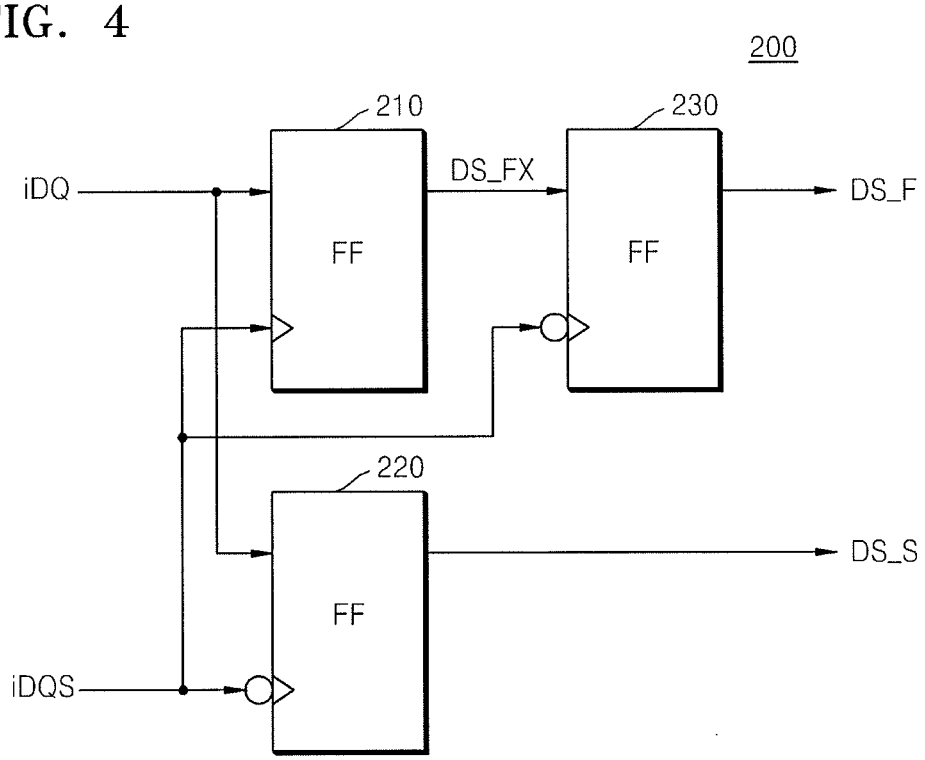
FIG. 4 illustrates an embodiment of a first data sampler.

FIG. 4 illustrates an embodiment of first data sampler 200. The first data sampler 200 may receive internal data signal iDQ and internal data strobe signal iDQS, and output data sequences DS_F and DS_S that respectively include the odd and even data included in the data sequence DS that is received, using internal data signal iDQ.

As illustrated in FIG. 4, first data sampler 200 may include a rising edge trigger flip-flop 210, and two falling edge trigger flip-flops 220 and 230. The rising edge trigger flip-flop 210 may receive internal data signal iDQ and may be controlled by internal data strobe signal iDQS. For example, rising edge trigger flip-flop 210 may sample internal data signal iDQ at the rising edge of the internal data strobe signal iDQS. Falling edge trigger flip-flop 220 may receive internal data signal iDQ, be controlled by the internal data strobe signal iDQS, and may sample internal data signal iDQ at the falling edge of the internal data strobe signal iDQS.

In order to synchronize a data sequence DS_FX output from the rising edge trigger flip-flop 210 and data sequence DS_S output from the falling edge trigger flip-flop 220, the falling edge trigger flip-flop 230 may sample the data sequence DS_FX output from rising edge trigger flip-flop 210 at falling edge of the internal data strobe signal iDQS. Accordingly, the durations of the data in data sequences DS_F or DS_S output from first data sampler 200 may be twice as long as the duration of the data in data sequence DS received by first data sampler 200. FIG. 3 illustrates internal data strobe signal iDQS and data sequences DS, DS_FX, DS_F, and DS_S that are related to the first data sampler 200.

Figure 5A:
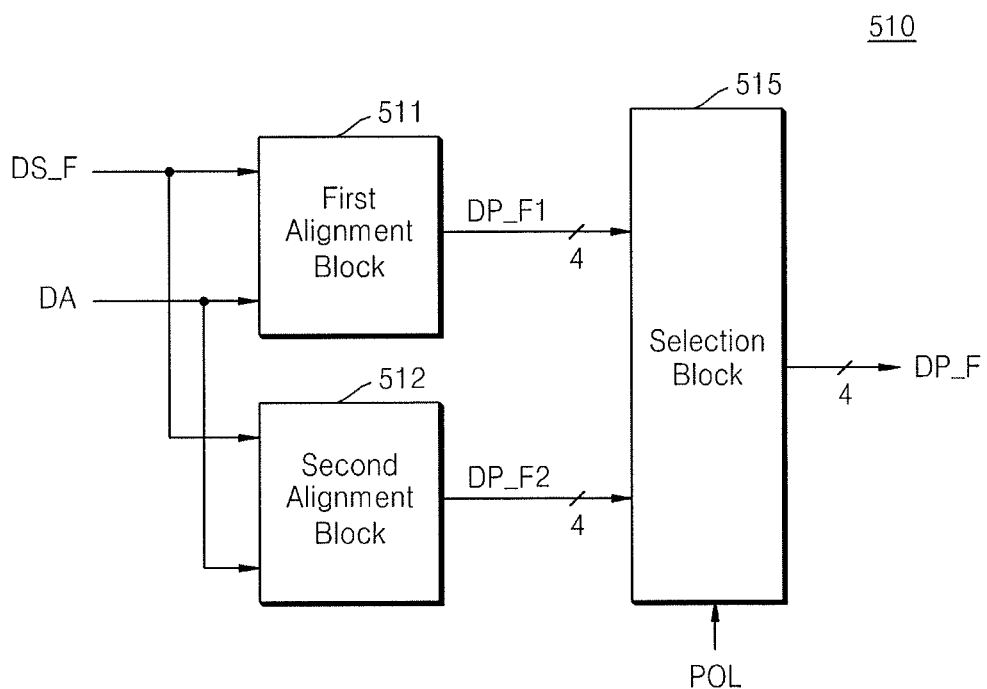
FIGS. 5A and 5B respectively illustrate odd alignment block and even alignment block in a data alignment block.
Figure 5B:
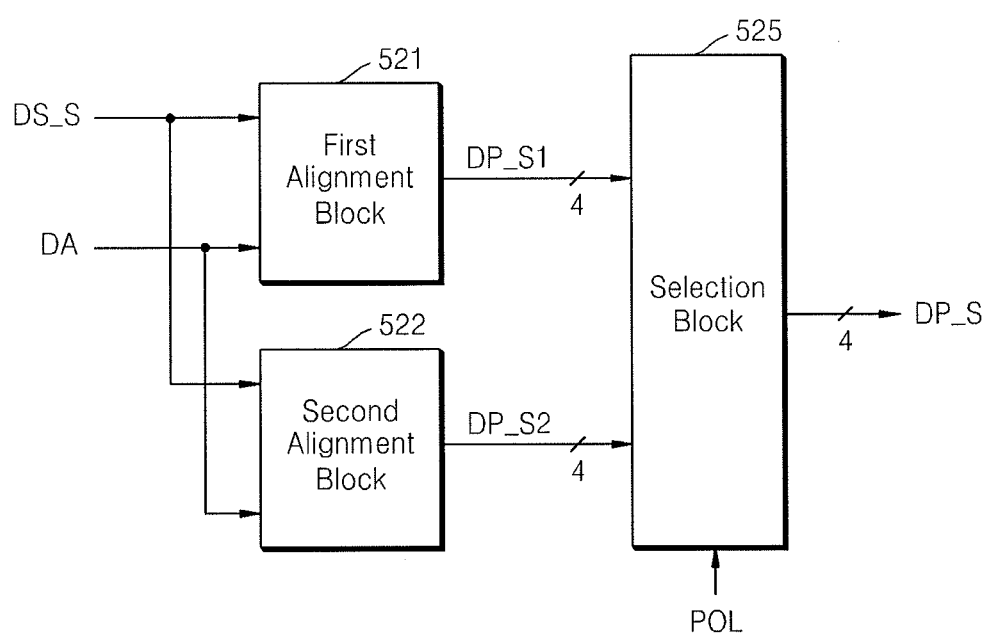

FIGS. 5A and 5B illustrate respective block diagrams of odd and even alignment blocks 510 and 520 in data alignment block 500. As described with reference to FIG. 1, the configurations of odd and even alignment blocks 510 and 520 in data alignment block 500 may be the same. However, input signals and output signals of the odd and even alignment blocks 510 and 520 may be different. For example, referring to FIGS. 5A and 5B, odd alignment block 510 may include a first alignment block 511, a second alignment block 512, and a selection block 515. Even alignment block 520 may include a first alignment block 521, a second alignment block 522, and a selection block 525. Respective configurations of the first alignment blocks 511 and 521 may be the same, respective configurations of the second alignment blocks 512 and 522 may be the same, and respective configurations of the selection blocks 515 and 525 may be the same.

As illustrated in FIG. 5A, odd alignment block 510 may include first and second alignment blocks 511 and 512 and selection block 515. The first and second alignment blocks 511 and 512 may receive data sequence DS_F and data alignment signal DA. The first and second alignment blocks 511 and 512 may respectively output first data DP_F1 and second data DP_F2, aligned in parallel, via 4 paths each.

The first alignment block 511 may align one of sequences that include odd or even data of data sequence DS_F according to the polarity of the data alignment signal DA, and may output first data DP_F1. The second alignment block 512 may align one of the sequences that include odd or even data of the data sequence DS_F according to the polarity of the data alignment signal DA, and may output second data DP_F2.

According to one embodiment, first and second alignment blocks 511 and 512 may align different sequences. For example, when the polarity of the data alignment signal DA is a first polarity, first alignment block 511 may align sequences that include odd data of data sequence DS_F, and may output the first data DP_F1. The second alignment block 512 may align sequences that include even data of the data sequence DS_F, and may output second data DP_F2. When the polarity of data alignment signal DA is a second polarity, the first and second alignment blocks 511 and 512 may operate in an opposite way.

The first and second alignment blocks 511 and 512 may align sequences that each include 4 blocks of data, and may respectively output the first and second data DP_F1 and DP_F2 via 4 paths. According to one embodiment, the first and second data DP_F1 and DP_F2 may be synchronized with data alignment signal DA. For example, durations of the first and second data DP_F1 and DP_F2 may be synchronized with the data alignment signal DA, which is generated by dividing the frequency of the internal data strobe signal iDQS by a predetermined number (e.g., 2) and, thus, may be twice as long as the duration of the data in data sequence DS_F.

The selection block 515 may receive first and second data DP_F1 and DP_F2 respectively from first and second alignment blocks 511 and 512, and may select a portion of the first and second data DP_F1 and DP_F2 according to the polarity signal POL. The selection block 515 may output the portion of the first and second data DP_F1 and DP_F2. As described above, first and second alignment blocks 511 and 512 may respectively output first and second data DP_F1 and DP_F2, via 4 paths each.

Then, selection block 515 may select the portion of the first and second data DP_F1 and DP_F2, which are received via a total of 8 paths, according to the polarity signal POL. The selection block 515 may output the portion of the first and second data DP_F1 and DP_F2 via 4 paths. For example, referring to FIG. 3, selection block 515 may output data DP_F. Data DP_F may include the 4 blocks of data D1, D3, D5, and D7 from among the first and second data DP_F1 and DP_F2 having a duration of 2 tCK. In the case of even alignment block 520 of FIG. 5B, selection block 525 in even alignment block 520 may output the data DP_S. The data DP_S may include the 4 blocks of data D2, D4, D6, and D8.

Referring to FIG. 3, the duration of data DP_F output from selection block 515 may be 2 tCK, due to first and second data DP_F1 and DP_F2 respectively output from first and second alignment blocks 511 and 512. The durations of first and second data DP_F1 and DP_F2, which are increased using the first and second alignment blocks 511 and 512, may be applied as they are to data DP_F output from selection block 515.

FIG. 5B illustrates a block diagram of even alignment block 520 according to one embodiment. As described above, even alignment block 520 and odd alignment block 510 of FIG. 5A have different input signals and output signals, but may have identical structures.

Figure 6A:
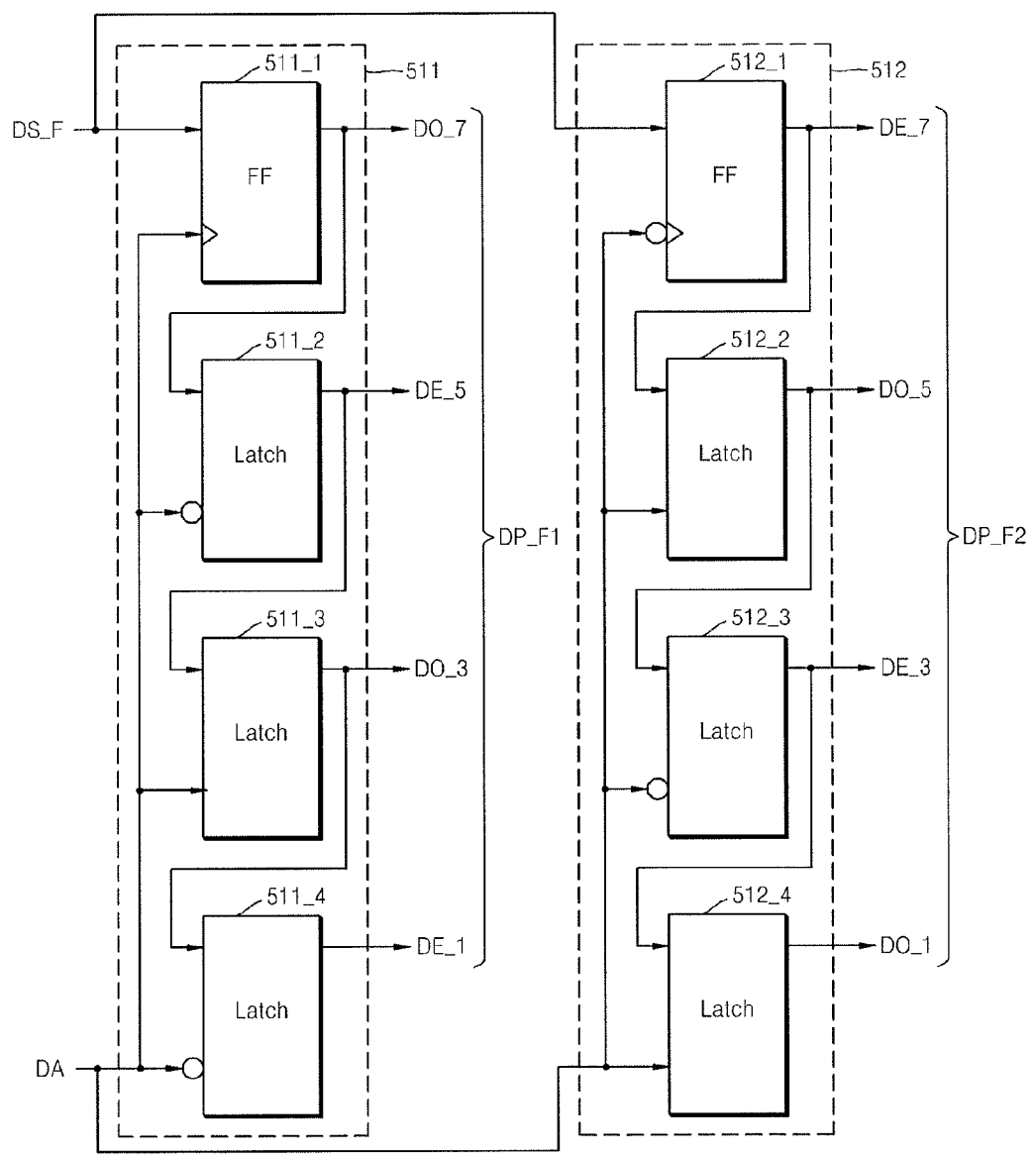
FIGS. 6A and 6B respectively illustrate first and second alignment blocks in each of the odd and even alignment blocks for a data alignment signal of a first polarity.
Figure 6B:
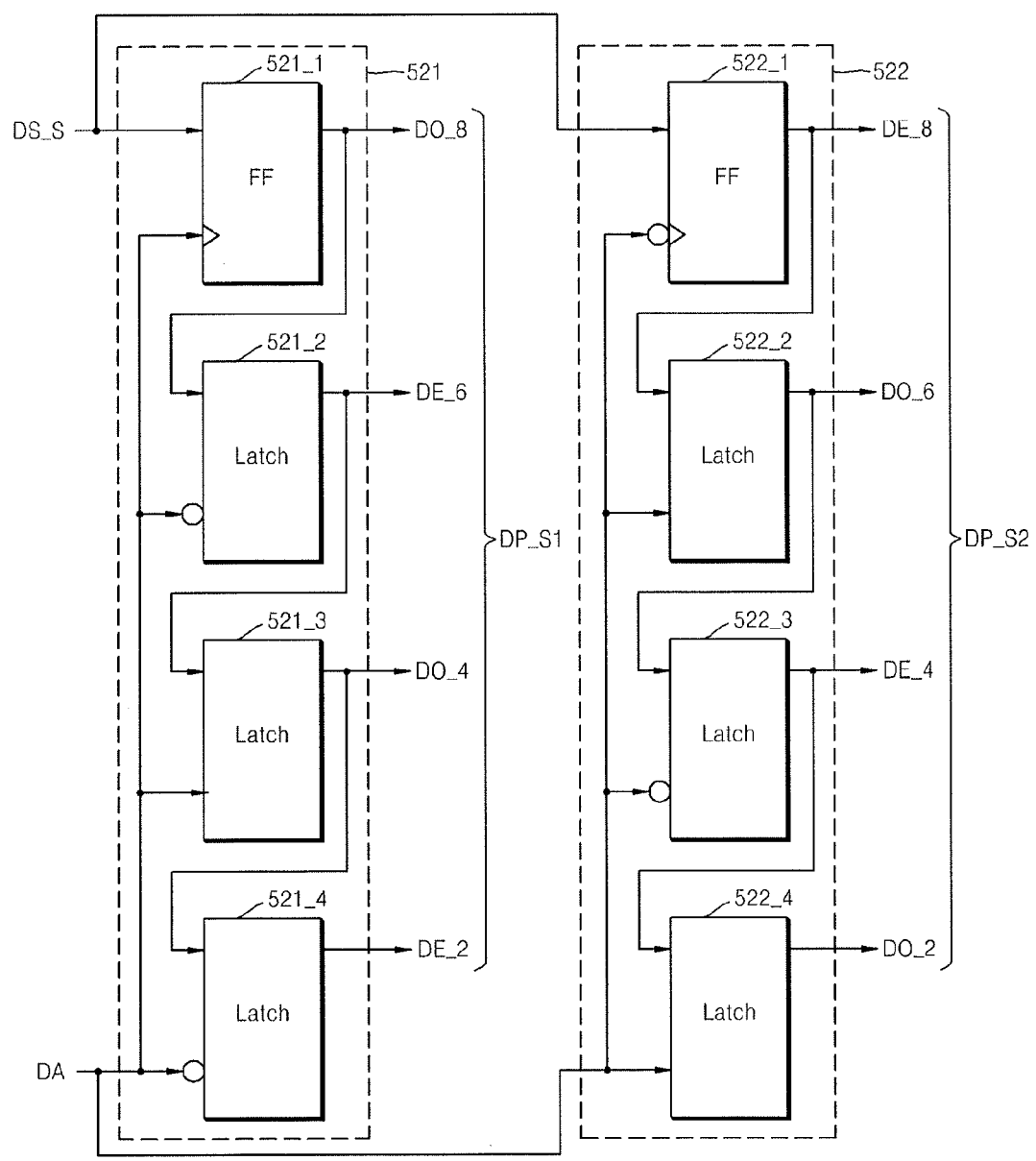

FIGS. 6A and 6B illustrate respective block diagrams of first and second alignment blocks 511 and 512 in odd alignment block 510 and first and second alignment blocks 521 and 522 in even alignment block 520 according to one or more embodiments. The respective configurations of the first alignment blocks 511 and 521 may be the same, and the respective configurations of the second alignment blocks 512 and 522 may be the same. Therefore, the first and second alignment blocks 511 and 512 in odd alignment block 510 will be described with reference to FIG. 6A.

The first and second alignment blocks 511 and 512 may receive data sequence DS_F and internal data strobe signal iDQS, and may respectively output first and second data DP_F1 and DP_F2 via 4 paths each. As in FIG. 3, FIGS. 6A and 6B illustrate an embodiment in which N=8. In the present embodiment, the first and second alignment blocks 511 and 512 may respectively output the first and second data DP_F1 and DP_F2 via 4 paths each.

As illustrated in FIG. 6A, first alignment block 511 may include a rising edge trigger flip-flop 511_1 and three latches 511_2 to 511_4. The rising edge trigger flip-flop 511_1 and latches 511_2 to 511_4 may be serially connected, and may be controlled by data alignment signal DA. Signals DO_7, DE_5, DO_3, and DE_1, which are respectively output from rising edge trigger flip-flop 511_1 and latches 511_2 to 511_4, may be output from first alignment block 511 and configure first data DP_F1.

In one embodiment, latches 511_2 to 511_4 may be D latches. As illustrated in FIG. 6A, latches 511_2 to 511_4 may respectively be a falling D latch, a rising D latch, and a falling D latch, and may be serially connected to the rising edge trigger flip-flop 511_1 in the order illustrated in FIG. 6A.

Also, as illustrated in FIG. 6A, second alignment block 512 may include a falling edge trigger flip-flop 512_1 and three latches 512_2 to 512_4. The falling edge trigger flip-flop 512_1 and latches 512_2 to 512_4 may be serially connected, and may be controlled by data alignment signal DA. Signals DE_7, DO_5, DE_3, and DO_1, which are respectively output from rising edge trigger flip-flop 512_1 and latches 512_2 to 512_4, may be externally output from the second alignment block 512 and may configure second data DP_F2. As illustrated in FIG. 6A, latches 512_2 to 512_4 may respectively be a rising D latch, a falling D latch, and a rising D latch, and may be serially connected to the falling edge trigger flip-flop 512_1 in the order illustrated in FIG. 6A.

The rising edge and falling edge trigger flip-flops 511_1 and 512_1 and latches 511_2 to 511_4 and 512_2 to 512_4, included in first and second alignment blocks 511 and 512, input and output data having a duration of 2 tCK. Thus, an operating speed of the rising edge and falling edge trigger flip-flops 511_1 and 512_1 and latches 511_2 to 511_4 and 512_2 to 512_4 may be slower than an operating speed of flip-flops and latches that input and output data having a duration of 1 tCK. As a result, sizes of transistors that configure the rising edge and falling edge trigger flip-flops 511_1 and 512_1 and latches 511_2 to 511_4 and 512_2 to 512_4 may be reduced. Accordingly, the size of the input data alignment circuit 10 may be reduced.

As respective sizes of the rising edge and falling edge trigger flip-flops 511_1 and 512_1 and latches 511_2 to 511_4 and 512_2 to 512_4 are reduced, the space for implementing odd alignment block 510 that includes first and second alignment blocks 511 and 512 may also be reduced. Therefore, referring to FIG. 2, although data alignment block 500 includes odd and even alignment blocks 510 and 520, the space for implementing data alignment block 500 may be similar to or smaller than a space for implementing a circuit that includes relatively large transistors, to output data that has a duration of 1 tCK and is aligned in parallel.

The semiconductor memory device may include a number of input data alignment circuits 10 that corresponds to a bit width of data sequence DS. Therefore, reducing the size of input data alignment circuit 10 may benefit the design of a semiconductor memory device, at least in terms of realizing a high degree of integration.

FIG. 6B illustrates a block diagram of the first and second alignment blocks 521 and 522 that are included in the even alignment block 520 according to one embodiment. The first and second alignment blocks 521 and 522 in the even alignment block 520 and the first and second alignment blocks 511 and 512 in the odd alignment block 510 have different input signals and output signals, but may have identical structures.

Figure 7A:
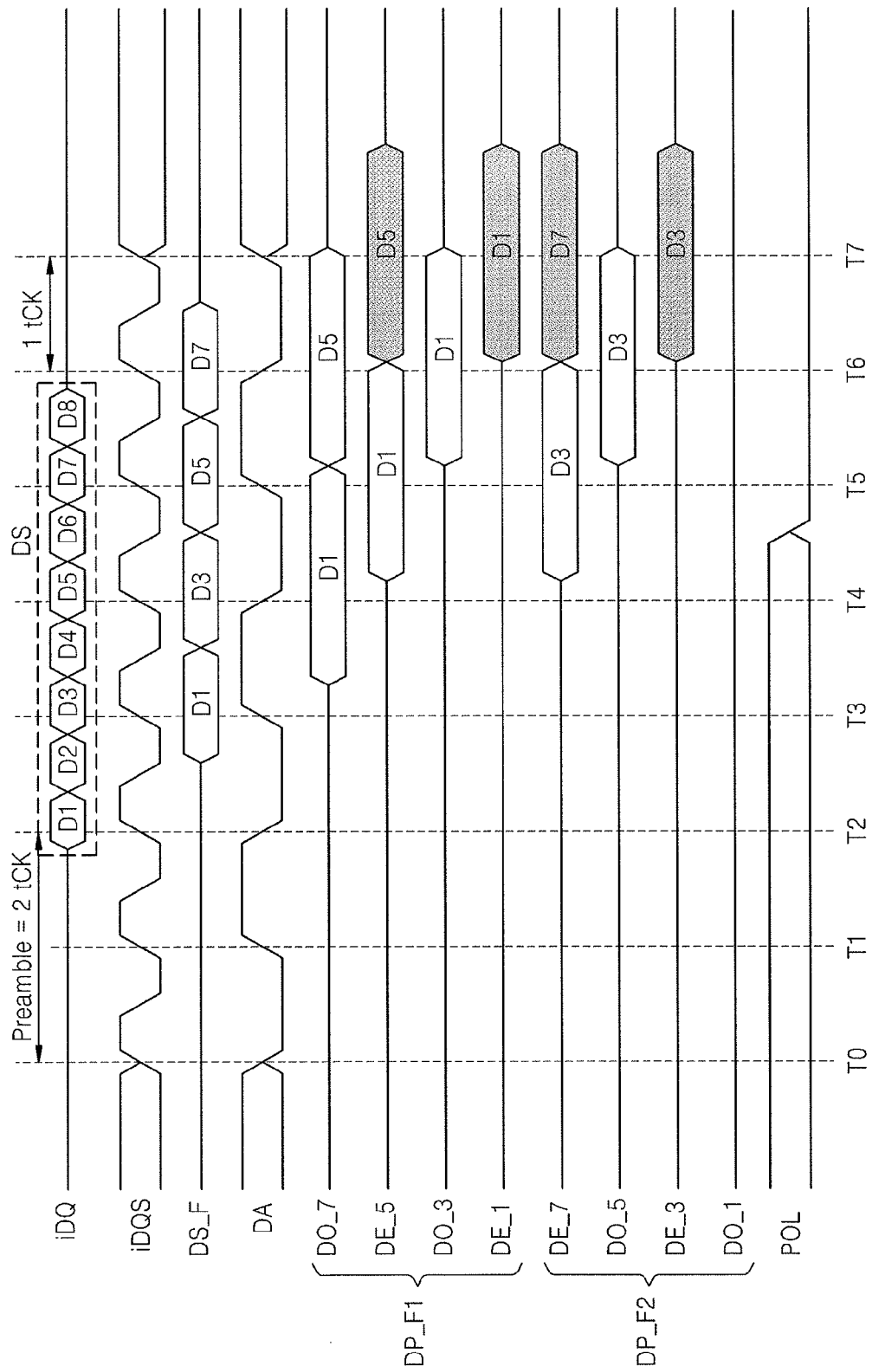

FIGS. 7A and 7B illustrate respective timing diagrams of operations of the first and second alignment blocks 511 and 512 in the odd alignment block 510 and operations of the first and second alignment blocks 521 and 522 in the even alignment lock 520, when the polarity of data alignment signal DA is the first polarity.

As illustrated in FIGS. 7A and 7B, when the preamble is 2 tCK, a falling edge of data alignment signal DA, which is generated by dividing the frequency of the internal data strobe signal iDQS by 2, may correspond to data D1 of the data sequence DS. The polarity of the data alignment signal DA, as illustrated in FIGS. 7A and 7B, is referred to as the first polarity or an even polarity. Therefore, the polarity signal POL, which is generated by the polarity determination block 400 of FIG. 1, transitions to a low level between a time point T4 and a time point T5.

FIG. 7A illustrates a timing diagram of the operations of the first and second alignment blocks 511 and 512 in the odd alignment block 510 according to an embodiment. Referring to FIGS. 6A and 7A, the first alignment block 511 may receive starting data D1 of the data sequence DS_F at time point T3. The rising edge trigger flip-flop 511_1 may respond to a rising edge of the data alignment signal DA at time point T3, and thus may sample data D1. The rising edge trigger flip-flop 511_1 may maintain data D1 until time point T5, when the next rising edge of data alignment signal DA occurs.

The falling D latch 511_2 connected to the rising edge trigger flip-flop 511_1 may respond to a low level of the data alignment signal DA between time points T4 and T5, and thus latch and output data D1 output from rising edge trigger flip-flop 511_1.

The rising D latch 511_3 connected to falling D latch 511_2 may respond to a high level of the data alignment signal DA between time point T5 and time point T6, and thus latch and output data D1 output from falling D latch 511_2.

The falling D latch 511_4 connected to rising D latch 511_3 may respond to the low level of the data alignment signal DA between time points T6 and T7, and thus latch and output data D1 output from rising D latch 511_3.

In addition, second alignment block 512 may receive data D1 of data sequence DS_F at time point T3. The falling edge trigger flip-flop 512_1 may respond to a falling edge of the data alignment signal DA at time point T4 and thus sample data D3. The falling edge trigger flip-flop 512_1 may maintain data D3 until time point T6 when the next falling edge of data alignment signal DA occurs.

The rising D latch 512_2 connected to falling edge trigger flip-flop 512_1 may respond to the high level of data alignment signal DA between time points T5 and T6, and thus latch and output data D3 output from falling edge trigger flip-flop 512_1.

The falling D latch 512_3 connected to rising D latch 512_2 may respond to the low level of data alignment signal DA between time points T6 and T7, and thus latch and output data D3 output from rising D latch 512_2.

As illustrated in FIG. 7A, according to the data alignment signal DA, which is generated by dividing the frequency of the internal data strobe signal iDQS by 2, a duration of data output from rising edge and falling edge trigger flip-flops 511_1 and 512_1 and latches 511_2 to 511_4 and 512_2 to 512_4, which are included in the first and second alignment blocks 511 and 512, may be 2 tCK.

As illustrated in FIG. 7A, signals DE_5 and DE_1, which are output from the first alignment block 511 from time point T6, respectively represent data D5 and D1. Signals DE_7 and DE_3, which are output from the second alignment block 512 from time point T6, respectively represent data D7 and D3. Therefore, the 4 blocks of data D1, D3, D5, and D7 in data sequence DS_F are aligned in parallel from time point T6, and respective durations of the 4 blocks of data D1, D3, D5, and D7 may all be 2 tCK.

FIG. 7B illustrates a timing diagram of the operations of the first and second alignment blocks 521 and 522 in the even alignment block 520 according to an embodiment. The operations of the first and second alignment blocks 521 and 522 in even alignment block 520 may be similar to the operations of the first and second alignment blocks 511 and 512 in odd alignment block 510.

As illustrated in FIG. 7B, signals DE_6 and DE_2, which are output from first alignment block 521 from time point T6, respectively represent data D6 and D2. Signals DE_8 and DE_4, which are output from the second alignment block 522 from time point T6, respectively represent data D8 and D4. Therefore, the 4 blocks of data D2, D4, D6, and D8 in data sequence DS_S are aligned in parallel from time point T6, and respective durations of the 4 blocks of data D2, D4, D6, and D8 may all be 2 tCK. As a result, as illustrated in FIGS. 7A and 7B, the 8 blocks of data D1 to D8 in data sequence DS may all be aligned in parallel at time point T7.

Figure 8A:
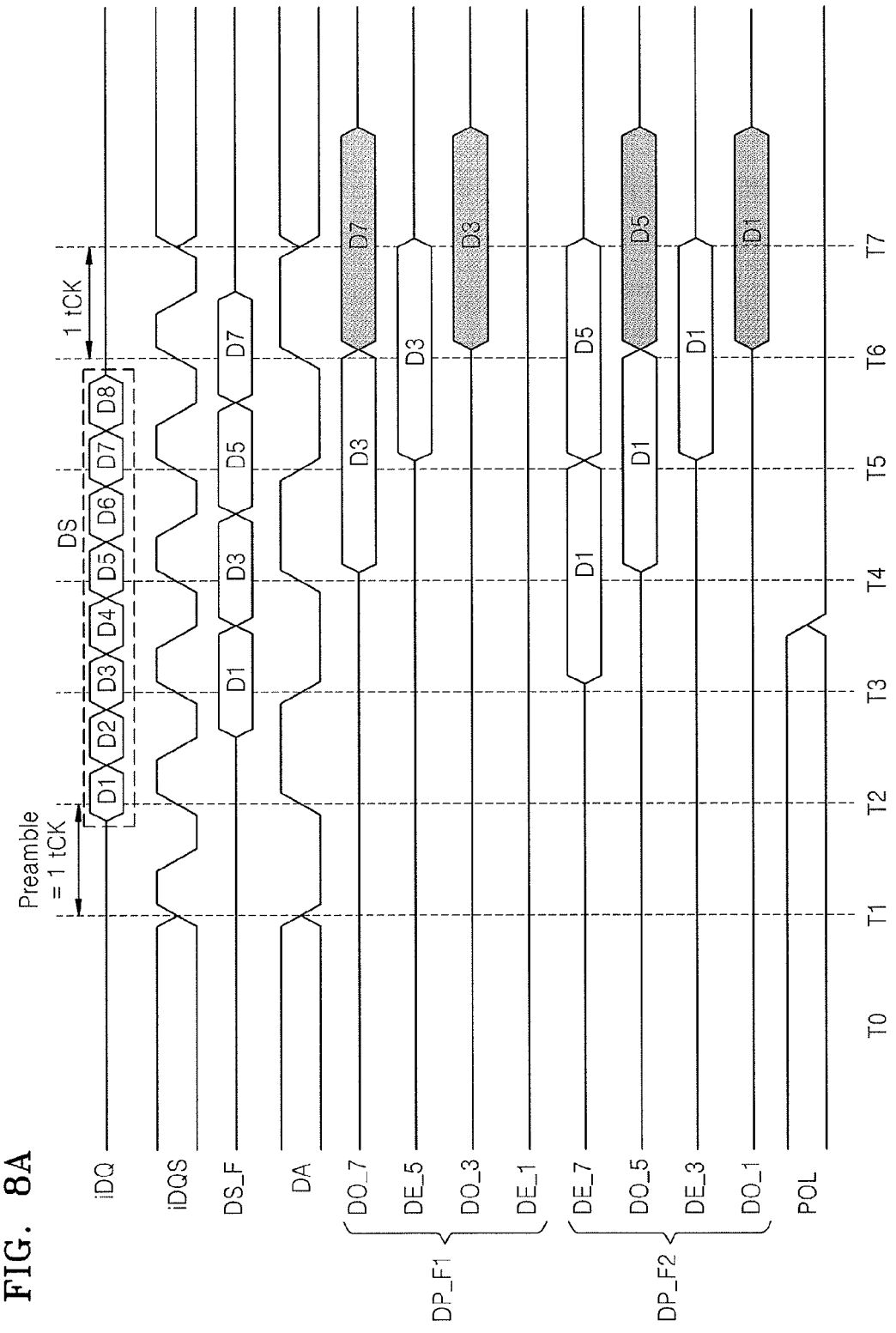
FIGS. 8A and 8B respectively illustrate operations of the first and second alignment blocks in the odd alignment block and the even alignment block for the data alignment signal having a second polarity.
Figure 8B:
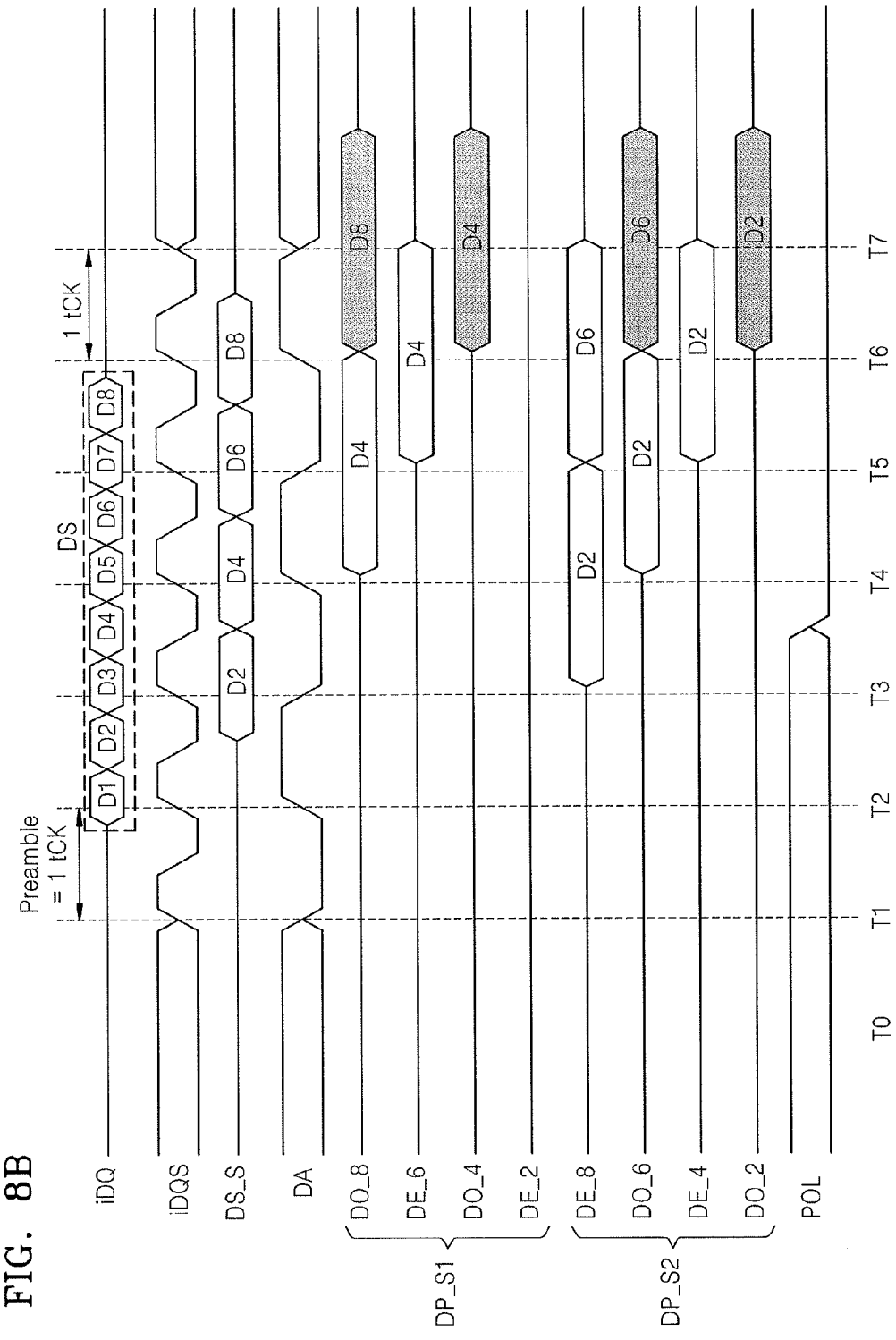

FIGS. 8A and 8B illustrate respective timing diagrams of operations of the first and second alignment blocks 511 and 512 in odd alignment block 510 and operations of the first and second alignment blocks 521 and 522 in even alignment block 520, when the polarity of data alignment signal DA is the second polarity. Unlike FIGS. 7A and 7B, when the preamble is 1 tCK in FIGS. 8A and 8B, a rising edge of data alignment signal DA, which is generated by dividing the frequency of the internal data strobe signal iDQS by 2, may correspond to starting data D1 of data sequence DS.

The polarity of the data alignment signal DA, as illustrated in FIGS. 8A and 8B, may be referred to as the second polarity or an odd polarity. As described above, the input data alignment circuit 10 according to one embodiment may align data sequence DS in parallel, independent from the polarity of data alignment signal DA. Therefore, as illustrated in FIGS. 8A and 8B, the polarity signal POL, which is generated by the polarity determination block 400 of FIG. 1, transitions to a low level between time points T3 and T4.

FIG. 8A illustrates a timing diagram of the operations of the first and second alignment blocks 511 and 512 in the odd alignment block 510 according to one embodiment. Referring to FIGS. 6A and 8A, the first alignment block 511 may receive data D1 of data sequence DS_F at time point T3. The rising edge trigger flip-flop 511_1 may respond to the rising edge of the data alignment signal DA at time point T4, and thus sample data D3. The rising edge trigger flip-flop 511_1 may maintain data D3 until time point T6 when the next rising edge of data alignment signal DA occurs.

The falling D latch 511_2 connected to rising edge trigger flip-flop 511_1 may respond to the low level of data alignment signal DA between time points T5 and T6, and thus latch and output data D3 output from rising edge trigger flip-flop 511_1.

The rising D latch 511_3 connected to falling D latch 511_2 may respond to the high level of data alignment signal DA between time points T6 and T7, and thus latch and output data D3 output from falling D latch 511_2.

The falling D latch 511_4 connected to rising D latch 511_3 may respond to the low level of the data alignment signal DA between time points T6 and T7, and thus latch and output data D3 output from rising D latch 511_3.

As illustrated in FIG. 8A, according to data alignment signal DA, which is generated by dividing the frequency of the internal data strobe signal iDQS by 2, the duration of data output from rising edge trigger flip-flop 511_1 and latches 511_2 to 511_4 may be 2 tCK.

In addition, the second alignment block 512 may receive data D1 of data sequence DS_F at time point T3. The falling edge trigger flip-flop 512_1 may respond to the falling edge of data alignment signal DA at time point T3 and thus sample the data D1. The falling edge trigger flip-flop 512_1 may maintain data D1 until time point T5 when the next falling edge of data alignment signal DA occurs.

The rising D latch 512_2 connected to falling edge trigger flip-flop 512_1 may respond to the high level of data alignment signal DA between time points T4 and T5, and thus latch and output data D1 output from falling edge trigger flip-flop 512_1.

The falling D latch 512_3 connected to rising D latch 512_2 may respond to the low level of the data alignment signal DA between time points T5 and T6, and thus latch and output data D1 output from rising D latch 512_2.

The rising D latch 512_4 connected to falling D latch 512_3 may respond to the high level of data alignment signal DA between time points T6 and T7, and thus latch and output data D1 output from falling D latch 512_3.

As illustrated in FIG. 8A, signals DO_7 and DO_3, which are output from the first alignment block 511 from time point T6, respectively represent data D7 and D3. Signals DO_5 and DO_1, which are output from the second alignment block 512 from time point T6, respectively represent data D5 and D1. Therefore, the 4 blocks of data D1, D3, D5, and D7 in data sequence DS_F are aligned in parallel from time point T6, and respective durations of the 4 blocks of data D1, D3, D5, and D7 may all be 2 tCK.

FIG. 8B illustrates a timing diagram of the operations of first and second alignment blocks 521 and 522 in even alignment block 520 according to one embodiment. The operations of first and second alignment blocks 521 and 522 in even alignment block 520 may be similar to operations of first and second alignment blocks 511 and 512 in odd alignment block 510.

As illustrated in FIG. 8B, signals DO_8 and DO_4, which are output from the first alignment block 521 from time point T6, respectively represent data D8 and D4. Signals DO_6 and DO_2, which are output from the second alignment block 522 from time point T6, respectively represent data D6 and D2. Therefore, the 4 blocks of data D2, D4, D6, and D8 in data sequence DS_S are aligned in parallel from time point T6, and respective durations of the 4 blocks of data D2, D4, D6, and D8 may all be 2 tCK. As a result, as illustrated in FIGS. 8A and 8B, the 8 blocks of data D1 to D8 in data sequence DS may all be aligned in parallel at time point T6.

As described above with reference to FIGS. 7A, 7B, 8A, and 8B, data alignment block 500 (which includes odd and even alignment blocks 510 and 520) may align data sequence DS that includes the 8 blocks of data D1 to D8 in parallel with a duration of 2 tCK, independent from the polarity of the data alignment signal DA.

Figure 9A:
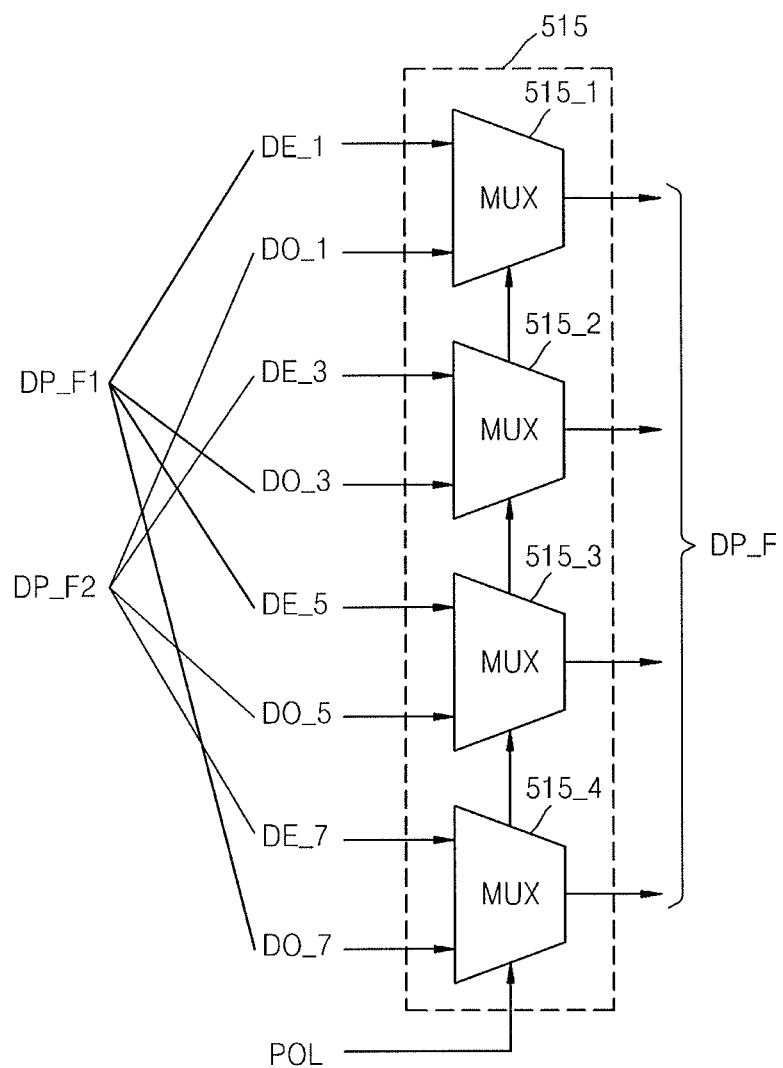
FIGS. 9A and 9B illustrate an embodiment of selection blocks.
Figure 9B:
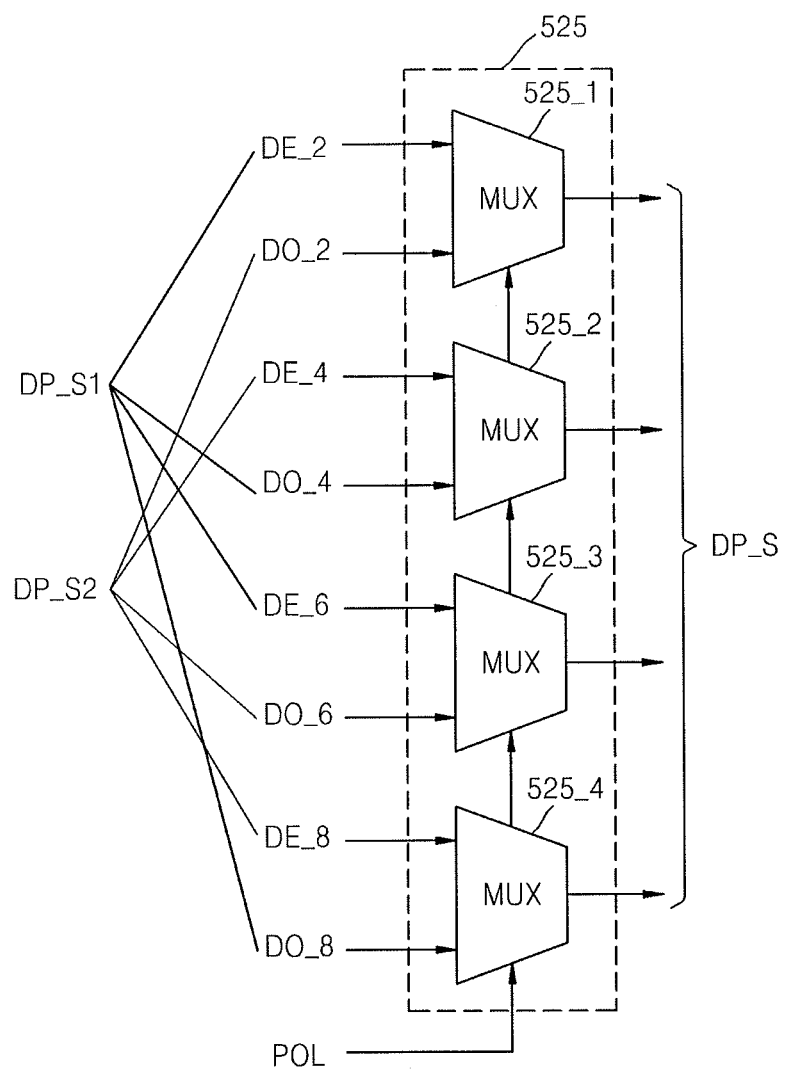

FIGS. 9A and 9B illustrate embodiments of selection blocks 515 and 525 that are respectively included in the odd and even alignment blocks 510 and 520 according to one embodiment. Referring to FIGS. 7A and 8A, based on the polarity of the data alignment signal DA, when a portion of the first and second data DP_F1 and DP_F2 (which are respectively output from the first and second alignment blocks 511 and 512 of the odd alignment block 510) is selected, the 4 blocks of data D1, D3, D5, and D7 in data sequence DS_F may be aligned in parallel. Accordingly, the selection block 515 may select a portion of the first and second data DP_F1 and DP_F2 according to the polarity signal POL that represents the polarity of the data alignment signal DA. The selection block 515 may therefore output data DP_F in which the 4 blocks of data D1, D3, D5, and D7 in data sequence DS_F are all aligned in parallel. The selection block 525 of the even alignment block 520 may output data DP_S, in which the 4 blocks of data D2, D4, D6, and D8 in data sequence DS_S are all aligned in parallel, based on polarity signal POL that represents the polarity of data alignment signal DA.

FIG. 9A illustrates a block diagram of the selection block 515 in odd alignment block 510 according to one embodiment. As illustrated in FIG. 9A, selection block 515 of odd alignment block 510 may include 4 multiplexers 515_1, 515_2, 515_3, and 515_4. Each of the multiplexers 515_1, 515_2, 5153, and 515_4 may receive a segment of data from first data DP_F1 or a segment of data from second data DP_F2, and may be controlled by polarity signal POL.

For example, as illustrated in FIGS. 7A and 7B, when the polarity of data alignment signal DA is the first polarity (even polarity), the polarity signal POL may be at a low level. Therefore, multiplexers 515_1, 5152, 515_3, and 515_4 may respectively select the 4 blocks of data DE_1, DE_3, DE_5, and DE_7 from the first and second data DP_F1 and DP_F2, and output the 4 blocks of data DE_1, DE_2, DE_3, and DE_4.

Alternatively, as illustrated in FIG. 8A, when the polarity of data alignment signal DA is the second polarity (odd polarity), the polarity signal POL may be at a high level. Therefore, multiplexers 515_1, 515_2, 5153, and 515_4 may respectively select the 4 blocks of data DO_1, DO_3, DO_5, and DO_7 from the first and second data DP_F1 and DP_F2, and output the 4 blocks of data DO_1, DO_2, DO_3, and DO_4.

FIG. 9B illustrates a block diagram of the selection block 525 in even alignment block 520 according to one embodiment. Operations of selection block 525 in even alignment block 520 may be similar to operations of selection block 515 in odd alignment block 510.

Figure 10:
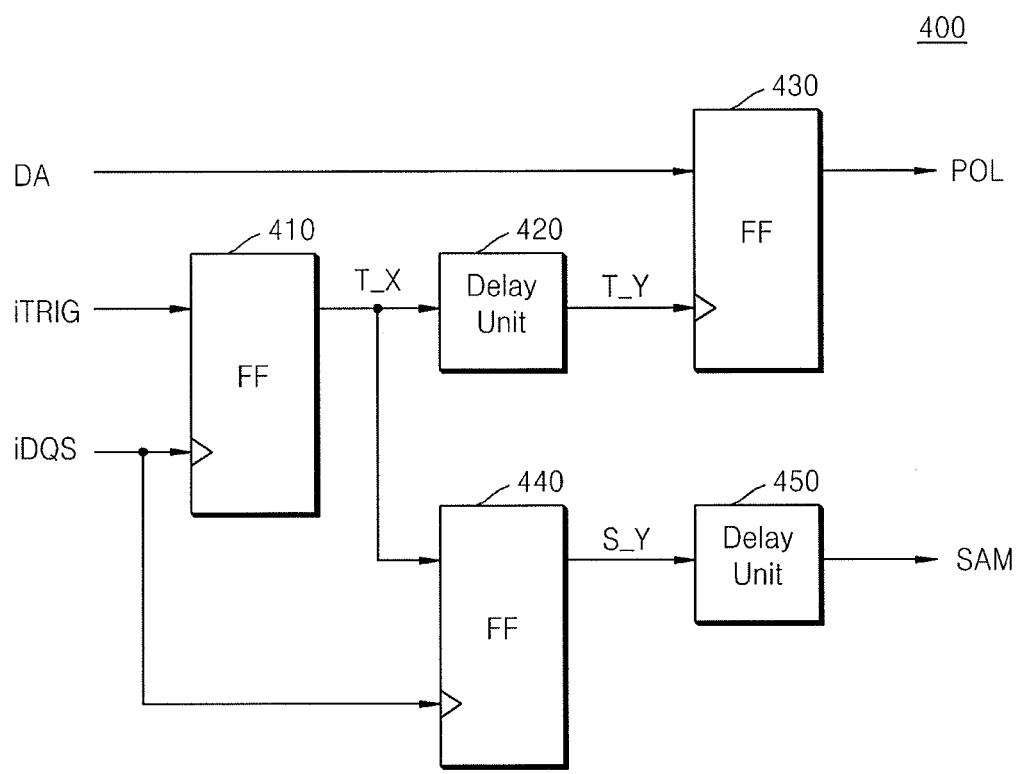
FIG. 10 illustrates polarity determination operations for one embodiment.

FIG. 10 illustrates an embodiment of operations of polarity determination block 400. Referring to FIGS. 1 and 10, polarity determination block 400 may generate polarity signal POL that represents the polarity of data alignment signal DA generated by frequency divider 300. The polarity signal POL generated by polarity determination block 400 may be used when the selection block 515 selects a portion of the first and second data DP_F1 and DP_F2 to output data DP_F. Also, polarity determination block 400 may generate sampling signal SAM used to sample data DP_F in second data sampler 600. As illustrated in FIG. 10, polarity determination block 400 may include rising edge trigger flip-flops 410, 430, and 440, and two delay units 420 and 450.

The rising edge trigger flip-flop 410 may receive the trigger signal iTRIG, and may be controlled by internal data strobe signal iDQS. That is, rising edge trigger flip-flop 410 may respond to the rising edge of internal data strobe signal iDQS, and then sample the trigger signal iTRIG. As illustrated in FIG. 1, trigger signal iTRIG provides advance notification that data sequence DS which includes the series of data will be input. The trigger signal iTRIG may be generated, for example, from the signals generated by decoding the data write commands received from the memory controller disposed outside the semiconductor memory device.

The delay unit 420 may delay a signal T_X output from rising edge trigger flip-flop 410. For example, delay unit 420 may include a plurality of inverters for delaying signal T_X. According to one embodiment, delay unit 420 may delay signal T_X less than 1 cycle (i.e., 1 tcK) of the internal data strobe signal iDQS, so that rising edge trigger flip-flop 430 may sample data alignment signal DA from a portion excluding falling and rising edges of data alignment signal DA. The rising edge trigger flip-flop 430 may receive data alignment signal DA, and may be controlled by a signal T_Y output from delay unit 420. That is, rising edge trigger flip-flop 430 may respond to a rising edge of the signal T_Y, sample data alignment signal DA, and output the polarity signal POL.

The rising edge trigger flip-flop 440 may receive signal T_X output from rising edge trigger flip-flop 410, and may be controlled by internal data strobe signal iDQS. That is, rising edge trigger flip-flop 440 may respond to the rising edge of internal data strobe signal iDQS, and then sample signal T_X. Thus, rising edge trigger flip-flop 440 may output a signal S_Y generated by delaying signal TX by 1 tCK. The delay unit 450 may delay signal S_Y output from rising edge trigger flip-flop 440. For example, delay unit 450 may delay signal S_Y so that a falling edge of sampling signal SAM may be at a time point appropriate for sampling data DP_F output from selection block 515.

Figure 11:
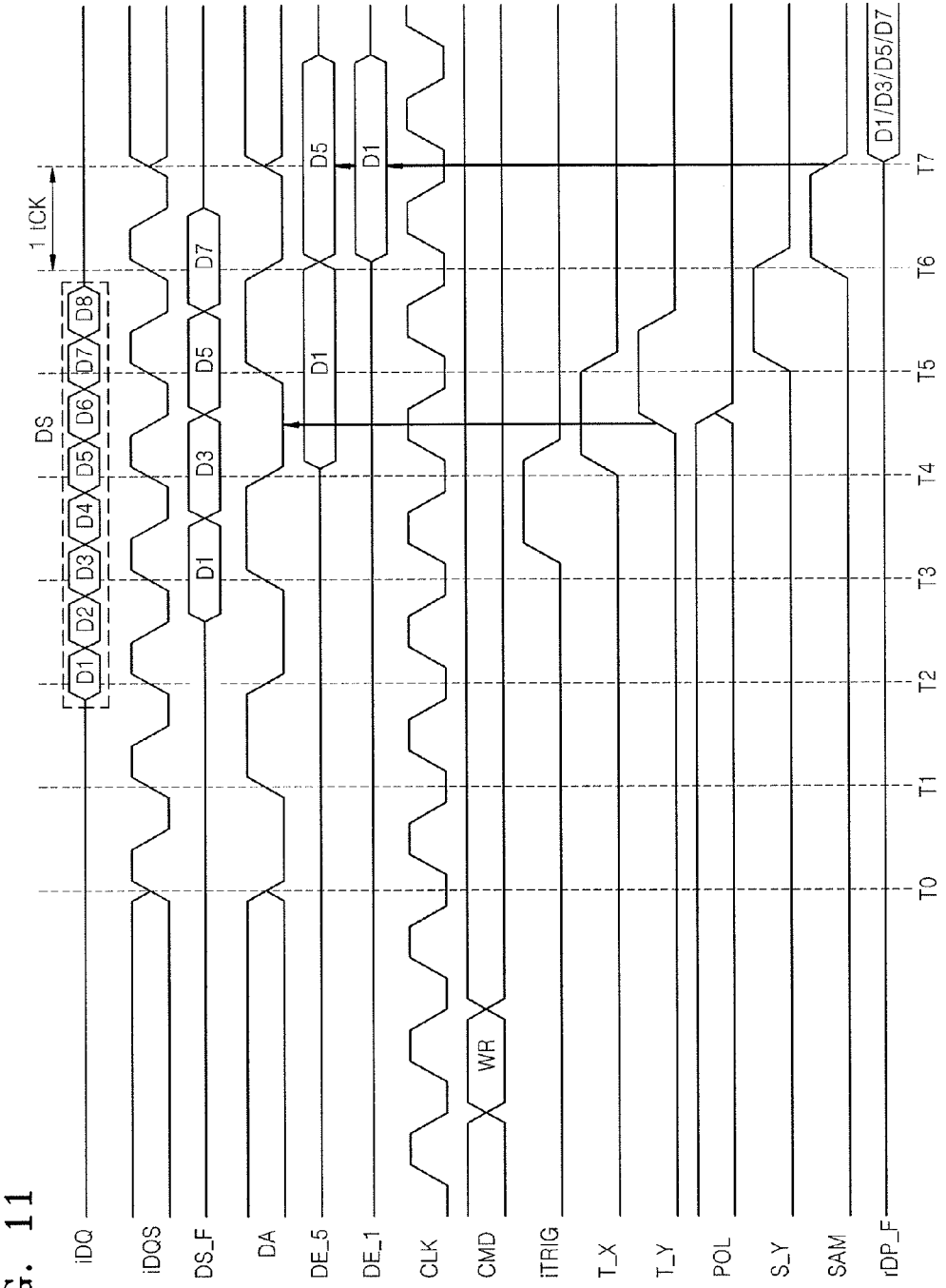
FIG. 11 illustrates a timing diagram for operations of the polarity determination block according to one embodiment.

FIG. 11 illustrates a timing diagram of operations of the polarity determination block 400 according to one embodiment. As illustrated in FIG. 11, the semiconductor memory device may externally receive a clock signal CLK and a command signal CMD. The clock signal CLK is for transmitting the command signal CMD, and the command signal CMD may be synchronized with the clock signal CLK. The clock signal CLK and data strobe signal DQS (or, the internal data strobe signal iDQS) may be not synchronized with each other. That is, there may be a phase difference between clock signal CLK and data strobe signal DQS. For brevity, only a portion (data DE_5 and DE_1) of the first data DP_F1 output from first alignment block 511 is illustrated in FIG. 11.

Referring to FIGS. 10 and 11, when the semiconductor memory device has externally received a write command WR, trigger signal iTRIG may be generated from a signal that is generated by decoding write command WR. The rising edge trigger flip-flop 410 may respond to the rising edge of the internal data strobe signal iDQS at time point T4, sample trigger signal iTRIG, and thus output signal T_X. The delay unit 420 may output signal T_Y by delaying signal T_X less than 1 tCK.

The rising edge trigger flip-flop 430 responds to the rising edge of signal T_Y between time points T4 and T5, samples data alignment signal DA, and outputs polarity signal POL. In the embodiment illustrated in FIG. 11, the polarity of data alignment signal DA is the first polarity (even polarity) as in the embodiment of FIGS. 7A and 7B. Accordingly, the polarity signal POL may transition to a low level between time points T4 and T5.

As illustrated in FIG. 11, at time point T6 (e.g., when first and second alignment blocks 511 and 512 output first and second data DP_F1 and DP_F2), the polarity signal POL may already be maintained at a low level. This indicates that the polarity of the data alignment signal DA is already the first polarity (even polarity). Therefore, selection block 515 may select a portion of first and second data DP_F1 and DP_F2 according to the polarity signal POL. The selection block 515 may then output the selected portion.

The rising edge trigger flip-flop 440 may output signal S_Y generated by delaying signal T_X by 1 tCK. The delay unit 450 may delay the signal S_Y so that the falling edge of sampling signal SAM is at a time point appropriate for sampling data DP_F (for example, in FIG. 11, near time point T7). In one embodiment, second data sampler 600 of FIG. 1 may respond to the falling edge of sampling signal SAM, sample the data DP_F, and output data rDP_F.

In FIG. 11, a duration of trigger signal iTRIG is 1 tCK. In other embodiments, the duration of trigger signal iTRIG received by input data alignment circuit 10 may be greater than 1 tCK, for example, 2 tCK to 3 tCK. Unlike FIG. 11, when the duration of the trigger signal iTRIG is 2 tCK, second data sampler 600 may use signal T_Y as the sampling signal SAM. Also, if trigger signal iTRIG is generated at a time point earlier than a time point in FIG. 11, polarity determination block 400 may transmit trigger signal iTRIG through a plurality of flip-flops controlled by internal data strobe signal iDQS.

Figure 12:
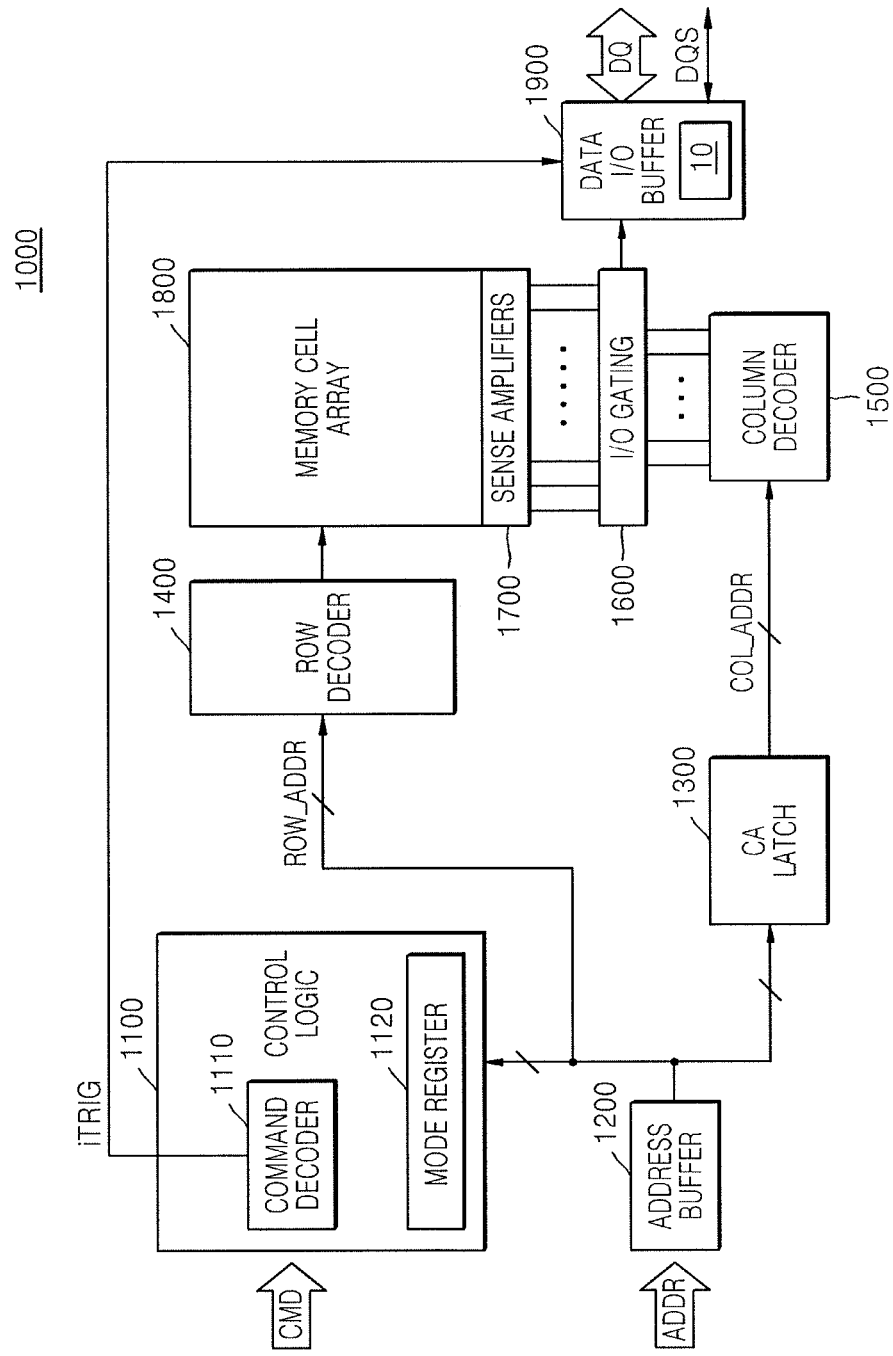
FIG. 12 illustrates an embodiment of a semiconductor memory device.

FIG. 12 illustrates an embodiment of a semiconductor memory device 1000 that includes input data alignment circuit 10. As illustrated in FIG. 12, semiconductor memory device 1000 includes control logic 1100, an address buffer 1200, a column address (CA) latch 1300, a row decoder 1400, a column decoder 1500, a memory cell array 1800, an I/O gating circuit 1600, sense amplifiers 1700, and a data I/O buffer 1900.

The semiconductor memory device 1000 may be dynamic random access memory (DRAM) such as double data rate synchronous dynamic random access memory (DDR SDRAM), low power double data rate (LPDDR) SDRAM, a graphics double data rate (GDDR) SDRAM, or Rambus DRAM (RDRAM); or any other volatile memory.

Control logic 1100 may control operations of the semiconductor memory device 1000. For example, control logic 1100 may generate control signals so that the semiconductor memory device 1000 performs write or read operations. Control logic 1100 may include command decoder 1110 that decodes command signal CMD from the memory controller that is outside of the semiconductor memory device, and a mode register 1120 for setting an operation mode of the semiconductor memory device 1000. For example, command decoder 1110 may decode a write command WR and thus generate trigger signal iTRIG. The control logic 1100 may further receive clock signal CLK and use the clock signal CLK to receive the command signal CMD.

The address buffer 1200 may receive an address ADDR that includes a row address ROW_ADDR and a column address COL_ADDR from the memory controller. The address buffer 1200 may provide the received row address ROW_ADDR to the row decoder 1400, and provide received column address COL_ADDR to the CA latch 1300. The row decoder 1400 may decode the row address ROW_ADDR provided from address buffer 1200, and activate a word line that corresponds to the row address ROW_ADDR. The CA latch 1300 may receive the column address COL_ADDR from address buffer 1200, and temporarily store the received column address COL_ADDR. In burst mode, the CA latch 1300 may gradually increase the received column address COL_ADDR. The CA latch 1300 may apply the column address COL_ADDR that is temporarily stored or gradually increased to the column decoder 1500.

The column decoder 1500 may activate sense amplifier 1700 that corresponds to column address COL_ADDR using I/O gating circuit 1600. The I/O gating circuit 1600 may include circuits that gate input and output data, an input data mask logic, and read data latches for storing data output from memory cell array 1800, and a writing driver for writing data in the memory cell array 1800.

Data to be read from memory cell array 1800 may be sensed and amplified using sense amplifier 1700, and may be stored in the read data latches. Data stored in the read data latches may be provided to the memory controller using data I/O buffer 1900. The data I/O buffer 1900 may include input data alignment circuit 10 according to one embodiment. The input data alignment circuit 10 may receive data signal DQ and data strobe signal DQS according to the burst write mode.

The input data alignment circuit 10 may receive data sequence DS that includes the series of data via data signal DQ. Then, input data alignment circuit 10 may align data sequence DS in parallel using a signal generated by dividing the frequency of the data strobe signal DQS by 2. Thus data may be generated with a duration increased to 2 tCK.

Next, input data alignment circuit 10 may selectively sample generated data and output data aligned in parallel. The data may be provided to I/O gating circuit 1600. The data that is aligned in parallel, which is output from input data alignment circuit 10, may be written in memory cell array 1800 using a write driver of I/O gating circuit 1600.

Figure 13:
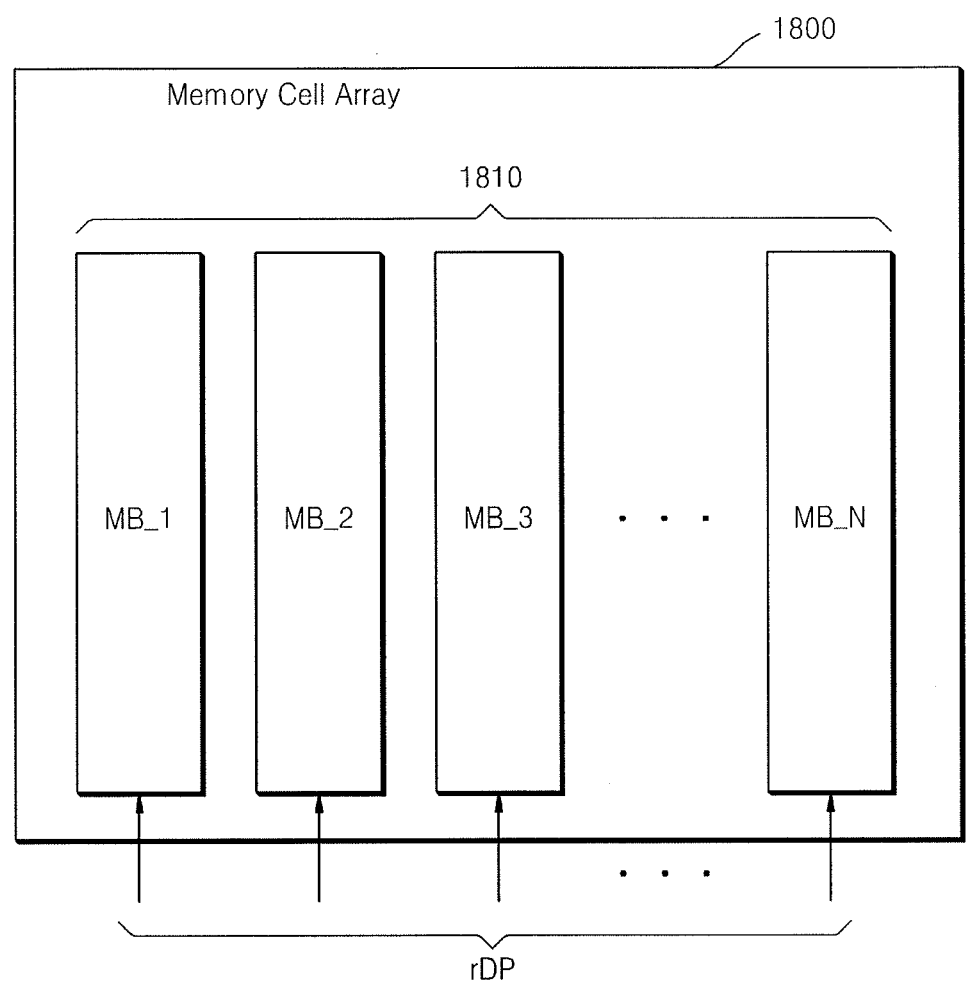
FIG. 13 illustrates an embodiment of a memory cell array.

FIG. 13 illustrates one embodiment of memory cell array 1800 in FIG. 12. As illustrated in FIG. 13, memory cell array 1800 may include N number of memory blocks MB_1 to MB_N. The N number of memory blocks MB_1 to MB_N may receive the data that is aligned in parallel, which is output from input data alignment circuit 10 of data I/O buffer 1900, via I/O gating circuit 1600. The N number of memory blocks MB_1 to MB_N 1810 may respectively correspond to blocks of data rDP output from N number of paths using input data alignment circuit 10. The data rDP output from input data alignment circuit 10 may be simultaneously received in each of the N number of memory blocks MB_1 to MB_N 1810.

Figure 14:
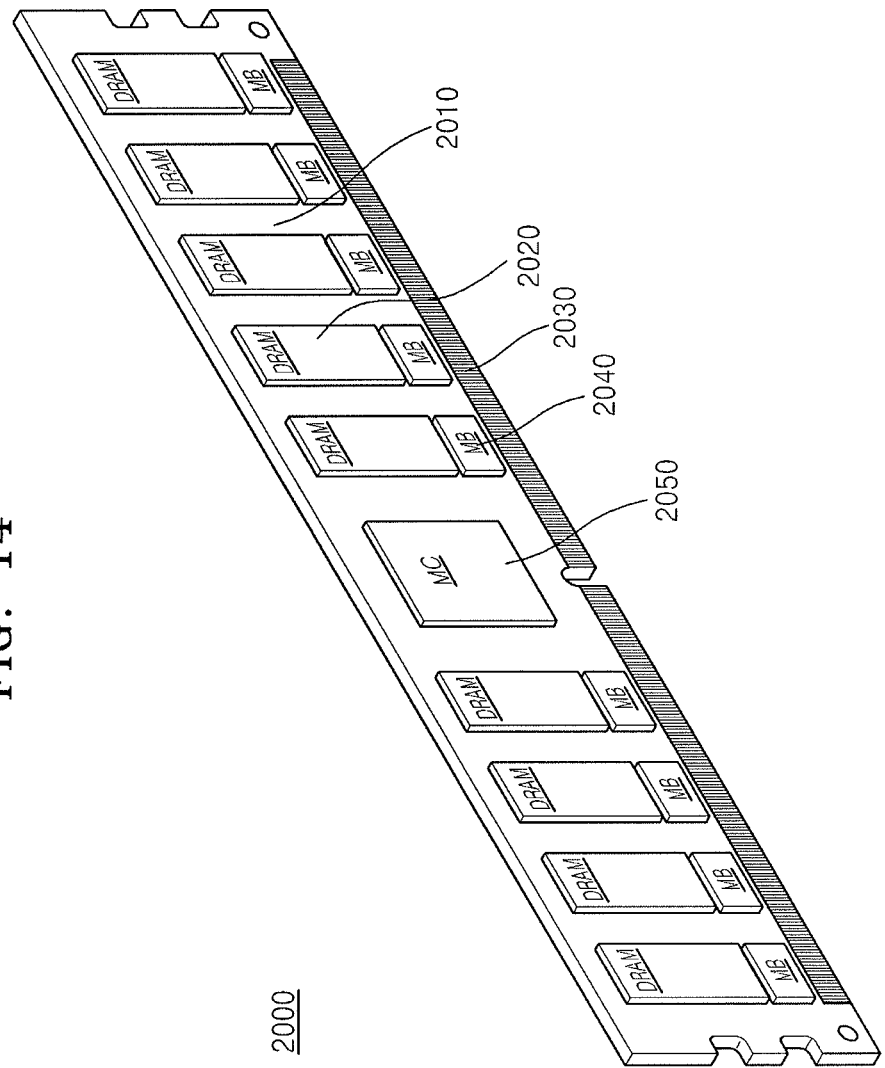
FIG. 14 illustrates an embodiment of a DRAM.

FIG. 14 illustrates an embodiment of a DRAM that includes an input data alignment circuit and a memory module 2000 that includes the memory controller. As illustrated in FIG. 14, memory module 2000 includes a printed circuit board (PCB) 2010, a plurality of DRAM chips 2020, a connector 2030, a plurality of buffer chips 2040, and a controller 2050. The controller 2050 communicates with the plurality of DRAM chips 2020 and the plurality of buffer chips 2040, and controls operation modes of the DRAM chips 2020. The controller 2050 may use a mode register of the DRAM chips 2040 to perform various functions, features, and control various modes.

Each of the DRAM chips 2020 may support a DDR mode and include a plurality of data input/output terminals, to which data is input and output according to the DDR mode. Also, each of the DRAM chips 2020 may include an input data alignment circuit which may be connected to the data input terminal.

The controller 2050 that is connected to each of the DRAM chips 2020 may include an input data alignment circuit according to one embodiment. The input data alignment circuit in the DRAM chips 2020 and controller 2050 may output data generated by aligning the data sequence that includes the series of data in parallel. For example, the input data alignment circuit may use a signal, which is generated by dividing the frequency of an internal data strobe signal by 2, to generate data with a duration increased to 2 tCK from the received data sequence. The generated data may then be selectively sampled, and output data may be aligned in parallel.

The plurality of buffer chips 2040 may store a result of testing properties of the DRAM chips 2020 that are connected thereto. The buffer chips 2040 may use stored information regarding the properties and manage operations of the DRAM chips 2020 so that the operations of the DRAM chips 2020 may be less affected by weak cells or weak pages. For example, the buffer chips 2040 may have a storage unit inside to manage the weak cells or weak pages of the DRAM chips 2020.

The memory module 2000 may be applied in a DRAM module such as a single in-line memory module (SIMM), a dual in-line memory module (DIMM), a small-outline DIMM (SO-DIMM), an unbuffered DIMM (UDIMM), a fully-buffered DIMM (FBDIMM), a rank-buffered DIMM (RBDIMM), load-reduced DIMM (LRDIMM), a mini-DIMM, and a micro-DIMM.

Figure 15:
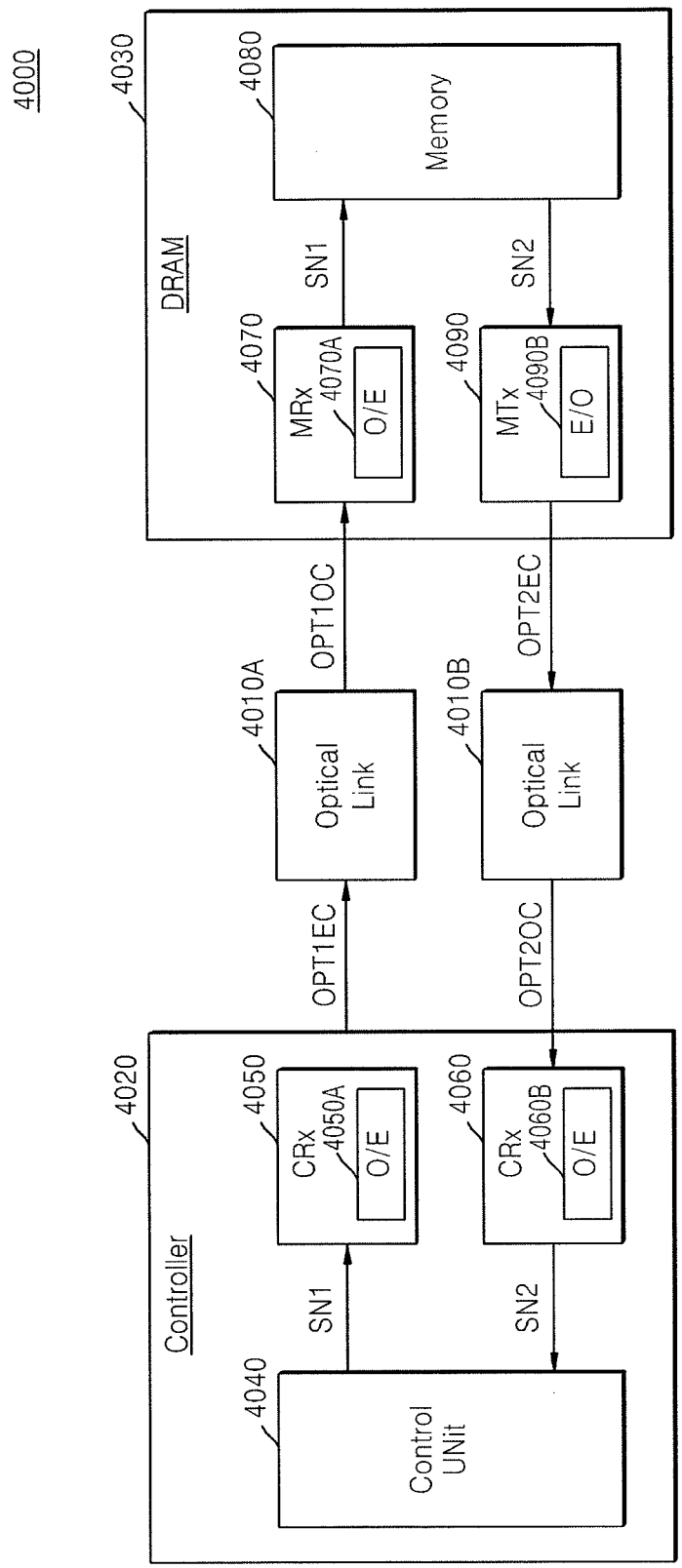
FIG. 15 illustrates an embodiment of a memory system.

FIG. 15 illustrates an embodiment of a memory system 4000 including an input data alignment circuit. As illustrated in FIG. 15, memory system 4000 includes optical links 4010A and 4010B, a controller 4020, and DRAM 4030. The optical links 4010A and 4010B connect controller 4020 to DRAM 4030. The controller 4020 includes a control unit 4040, a first transmitter 4050, a first receiver 4060. The control unit 4040 transmits a first electric signal SN1 to the first transmitter 4050. The first electric signal SN1 may include command signals, clock signals, address signals, or write data, which are transmitted to the DRAM 4030.

The first transmitter 4050 includes a first optical modulator 4050A. The first optical modulator 4050A may convert the first electric signal SN1 into a first optic transmission signal OTP1EC, and transmit the first optic transmission signal OTP1EC to optical link 4010A. The first optic transmission signal OTP1EC may be transmitted serially via optical link 4010A.

The first receiver 4060 includes a first optical demodulator 4060B. The first optical demodulator 4060B converts a second optical reception signal OPT2OC, received from optical link 4010B, to a second electric signal SN2. The second electric signal SN2 is transmitted to control unit 4040. The second electric signal SN2 may include data signal DQ and data strobe signal DQS.

The control unit 4040 may include the input data alignment circuit in accordance with one or more embodiments described herein. For example, the input data alignment circuit may use a signal, generated by dividing the frequency of the internal data strobe signal by 2, to generate data with a duration increased to 2 tCK from the received data sequence. The input data alignment circuit may then selectively sample the generated data and output the data that is aligned in parallel.

The DRAM 4030 may include a second receiver 4070, a memory area 4080 including a memory cell array, and a second transmitter 4090. The second receiver 4070 includes a second optical modulator 4070A. The second optical modulator 4070A may convert a first optical reception signal OPT1OC received from optical link 4010A into a first electric signal SN1, and transmit the first electric signal SN1 to memory area 4080.

The memory area 4080 may respond to the first electric signal SN1, and write data in a memory cell, or may transmit data that is read from memory area 4080 to the second transmitter 4090, as a second electric signal SN2. The first electric signal SN1 may include signals that correspond to input data sequence DQ and data strobe signal DQS.

The memory area 4080 may include an input data alignment circuit according to one or more of the aforementioned embodiments. For example, the input data alignment circuit may use a signal, generated by dividing the frequency of the internal data strobe signal by 2, to generate data with a duration increased to 2 tCK from the received data sequence. The input data alignment circuit may then selectively sample the generated data and output data that is aligned in parallel.

The second electric signal SN2 may include clock signals and read data that are transmitted to the controller 4020. The second transmitter 4090 includes a second optical demodulator 4090B. The second optical demodulator 4090B may convert the second electric signal SN2 into a second optical transmission signal OPT2EC, and transmit the second optical transmission signal OPT2EC to the optical link 4010B. The second optical transmission signal OTP2EC is transmitted in serial communication via the optical link 4010B.

Figure 16:
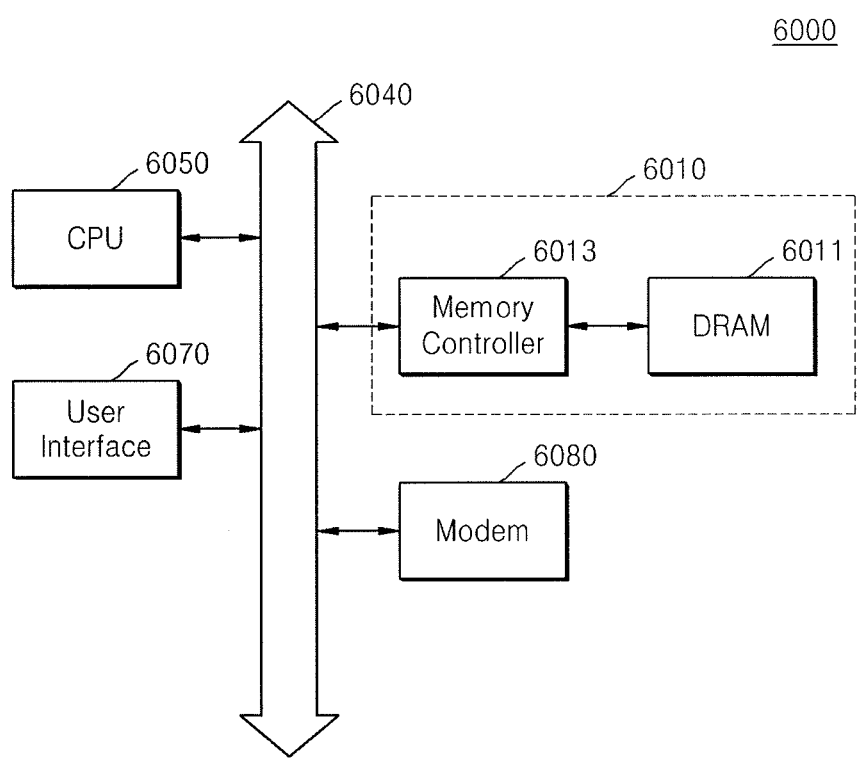
FIG. 16 illustrates an embodiment of a computer system.

FIG. 16 illustrates an embodiment of a computer system 6000 including a memory controller 6013 that includes an input data alignment circuit and DRAM 6011. The computer system 6000 may be provided in mobile devices or desktop computers. The computer system 6000 may include a system bus 6040, a DRAM memory system 6010 that is electrically connected to the system bus 6040, a central processing unit (CPU) 6050, a user interface 6070, and a modem 6080, such as baseband chipset. The computer system 6000 may further include application chipset, a camera image processor (CIP), and an I/O device.

The user interface 6070 may be an interface for transmitting or receiving data to or from a communication network. The user interface 6070 may be wired or wireless, and may include an antenna or a wired or wireless transceiver. Data provided via the user interface 6070 or modem 6080, or data processed by CPU 6050, may be stored in DRAM memory system 6010.

The DRAM memory system 6010 may include DRAM 6011 and memory controller 6013. The DRAM 6011 stores data processed by CPU 6050 or externally inputted data. The DRAM 6011 and memory controller 6013 may each include an input data alignment circuit according to one or more of the aforementioned embodiments. For example, the input data alignment circuit may use a signal, generated by dividing the frequency of the internal data strobe signal by 2, to generate data with a duration increased to 2 tCK from the received data sequence. The input data alignment circuit may then selectively sample the generated data and output data aligned in parallel.

If the computer system 6000 is a wireless communication device, the computer system 6000 may be used in communication systems such as code division multiple access (CDMA), global system for mobile communication (GSM), North American multiple access (NADC), and CDMA2000. The computer system 6000 may be applied to information processing devices such as personal digital assistants (PDAs), mobile computers, web tablets, digital cameras, portable media players (PMPs), mobile phones, wireless phones, or laptop computers.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An input data alignment circuit, comprising:
   an input data sampler to provide a data sequence based on data serially input according to a data strobe signal;
   a frequency divider to generate a data alignment signal based on a divided frequency of the data strobe signal;
   a polarity determination block to determine a polarity of the data alignment signal and to provide a control signal based on the determined polarity; and
   a data alignment block to align the data sequence in parallel according to the data alignment signal and control signal, and to generate output data.

2. The circuit as claimed in claim 1, wherein the data alignment block includes:
   first and second alignment blocks to respectively output first and second data by aligning one of sequences that are synchronized with the data alignment signal or include odd data and even data of the data sequence in parallel; and
   a selection block to select and output a portion of the first and second data based on the control signal.

3. The circuit as claimed in claim 2, wherein each of the first and second alignment blocks align the odd data or the even data of the data sequence in parallel based on the polarity of the data alignment signal.

4. The circuit as claimed in claim 3, wherein:
   the first alignment block includes a rising edge trigger flip-flop and at least one first latch which are controlled by the data alignment signal and are serially connected, wherein first data is output from the rising edge trigger flip-flop and the at least one first latch, and
   the second alignment block includes a falling edge trigger flip-flop and at least one second latch which are controlled by the data alignment signal and serially connected, wherein second data is output from the falling edge trigger flip-flop and the at least one second latch.

5. The circuit as claimed in claim 1, wherein the polarity determination block includes:
   a first sampler to sample a trigger signal that prearranges serial input of the data by the input data strobe signal;
   a delay unit to delay a signal output from the first sampler; and
   a second sampler to sample the data alignment signal based on a signal output from the delay unit, the second sampler to output the control signal.

6. The circuit as claimed in claim 5, wherein the delay unit is to delay the signal output from the first sampler by less than a cycle of the input data strobe signal.

7. The circuit as claimed in claim 5, wherein:
   the polarity determination block outputs a sample signal based on delaying the trigger signal, and
   the input data alignment circuit includes an output data sampler to sample the output data as the sample signal.

8. A semiconductor device, comprising:
   an input data alignment circuit to generate output data by aligning data in parallel and to output the output data via N number of paths, the output data based on data serially input according to a data strobe signal; and
   a data storage block including N number of memory blocks in which the output data is to be simultaneously written, wherein the input data alignment circuit is to generate a data alignment signal by dividing a frequency of the data strobe signal, align the data that is serially input in parallel according to a polarity of the data alignment signal, and to generate the output data.

9. The semiconductor device as claimed in claim 8, wherein the input data alignment circuit includes:
   an input data sampler to provide the serially input data according to the data strobe signal as a data sequence;
   a frequency divider to divide a frequency of the data strobe signal and to thereby generate the data alignment signal;
   a polarity determination block to determine the polarity of the data alignment signal and to thereby provide a control signal; and
   a data alignment block to align the data sequence in parallel according to the data alignment signal and the control signal, and to thereby generate output data.

10. The semiconductor device as claimed in claim 9, wherein the data alignment block includes:
    first and second alignment blocks to respectively output first and second data by aligning one of sequences that are synchronized with the data alignment signal or that include odd data and even data of the data sequence in parallel; and
    a selection block to select and output a portion of the first and second data based on the control signal.

11. The semiconductor device as claimed in claim 10, wherein each of the first and second alignment blocks are to align the odd data or the even data of the data sequence in parallel based on the polarity of the data alignment signal.

12. The semiconductor device as claimed in claim 9, wherein the polarity determination block includes:
    a first sampler to sample a trigger signal that prearranges serial input of the data based on the input data strobe signal;
    a delay unit to delay a signal output from the first sampler; and
    a second sampler to sample the data alignment signal based on a signal output from the delay unit, and to thereby output the control signal.

13. The semiconductor device as claimed in claim 12, wherein the delay unit is to delay the signal output from the first sampler by less than a cycle of the input data strobe signal.

14. The semiconductor device as claimed in claim 8, wherein:
    the semiconductor device is a memory controller to control a semiconductor memory device, and
    the input data alignment circuit is to operate in a burst read mode of the semiconductor memory device.

15. The semiconductor device as claimed in claim 8, wherein:
    the semiconductor device is a semiconductor memory device,
    the memory block includes a plurality of dynamic random access memory (DRAM) cells, and
    the input data alignment circuit is to operate in a burst read mode of the semiconductor memory device.

16. An apparatus, comprising:
   a first block to generate a control signal based on a polarity of a data alignment signal; and
   a second block to align a data sequence based on control signal, wherein the data alignment signal is based on a divided frequency of a data strobe signal and wherein the second block is to align at least one of a forward edge or a trailing edge of data blocks in the data sequence based on the data alignment signal.

17. The apparatus as claimed in claim 16, further comprising:
   a sampler to sample serial data based on the data strobe signal,
   wherein the data sequence is based on the sampled serial data.

18. The apparatus as claimed in claim 16, wherein the second block includes:
   first and second alignment blocks to respectively output first and second data by aligning one of sequences that are synchronized with the data alignment signal or include odd data and even data of the data sequence in parallel; and
   a selection block to select and output a portion of the first and second data based on the control signal.

19. The apparatus as claimed in claim 18, wherein each of the first and second alignment blocks align odd data or even data of the data sequence in parallel based on the polarity of the data alignment signal.

20. The apparatus as claimed in claim 19, wherein:
   the first alignment block includes a rising edge trigger flip-flop and at least one first latch which are controlled by the data alignment signal, wherein first data is output from the rising edge trigger flip-flop and the at least one first latch, and
   the second alignment block includes a falling edge trigger flip-flop and at least one second latch which are controlled by the data alignment signal, wherein second data is output from the falling edge trigger flip-flop and the at least one second latch.

* * * * *